US012690471B2

(12) United States Patent
Hirano et al.

(10) Patent No.: US 12,690,471 B2
(45) Date of Patent: Jul. 21, 2026

(54) SEMICONDUCTOR DEVICE FOR UPPER AND LOWER ARM CIRCUITS

(71) Applicant: DENSO CORPORATION, Kariya-city (JP)

(72) Inventors: Takahiro Hirano, Kariya-city (JP); Masayoshi Nishihata, Kariya-city (JP); Chihiro Kato, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 364 days.

(21) Appl. No.: 18/474,325

(22) Filed: Sep. 26, 2023

(65) Prior Publication Data

US 2024/0145349 A1       May 2, 2024

(30) Foreign Application Priority Data

Nov. 2, 2022     (JP) ................................. 2022-176590

(51) Int. Cl.
H10W 90/00         (2026.01)
H10W 70/40         (2026.01)
*H10W 72/60*          (2026.01)

(52) U.S. Cl.
CPC ......... H10W 70/464 (2026.01); H10W 90/00 (2026.01); H10W 90/811 (2026.01); *H10W 70/481* (2026.01); *H10W 72/631* (2026.01); *H10W 72/652* (2026.01); *H10W 72/655* (2026.01); *H10W 90/763* (2026.01); *H10W 90/766* (2026.01); *H10W 90/767* (2026.01)

(58) Field of Classification Search
None
See application file for complete search history.

(56) References Cited

U.S. PATENT DOCUMENTS

| | | | |
|---|---|---|---|
| D954,667 S | 6/2022 | McPherson et al. | |
| 2015/0194372 A1* | 7/2015 | Ikeuchi | ................. H01L 23/645 257/675 |
| 2016/0133597 A1 | 5/2016 | Kouno | |
| 2017/0110395 A1 | 4/2017 | Iwabuchi et al. | |

(Continued)

FOREIGN PATENT DOCUMENTS

| | | |
|---|---|---|
| JP | 2015-186438 A | 10/2015 |
| JP | 6123722 B2 | 5/2017 |

(Continued)

*Primary Examiner* — Sue A Purvis
*Assistant Examiner* — Seyon Ali-Simah Punchbeddell
(74) *Attorney, Agent, or Firm* — Posz Law Group, PLC

(57) ABSTRACT

A semiconductor device includes: a first element for one of upper and lower arm circuits; a second element for the other of the upper and lower arm circuits; a first wiring having a first mounting portion on which the first element is disposed and a first power supply terminal portion connected with the first mounting portion; a second wiring having a second mounting portion on which the second element is disposed and an output terminal portion connected with the second mounting portion; a clip configured to electrically connect a main electrode of the first element and the second mounting portion; and a third wiring having a connection portion to which a main electrode of the second element is connected and a second power supply terminal portion connected with the connection portion. The third wiring is extended parallel to the first wiring and the clip.

7 Claims, 24 Drawing Sheets

(56)     References Cited

U.S. PATENT DOCUMENTS

| 2018/0206359 | A1 | 7/2018 | McPherson et al. |
| 2018/0240732 | A1 | 8/2018 | Tonedachi |
| 2019/0051636 | A1 | 2/2019 | Tonedachi |
| 2019/0181770 | A1 | 6/2019 | Martin et al. |
| 2019/0191585 | A1 | 6/2019 | McPherson et al. |
| 2020/0027807 | A1 | 1/2020 | Cheng et al. |
| 2020/0029455 | A1 | 1/2020 | Hong et al. |
| 2020/0053900 | A1 | 2/2020 | Feurtado et al. |
| 2020/0304037 | A1 | 9/2020 | Martin et al. |
| 2021/0057389 | A1 | 2/2021 | Ishino |
| 2021/0136947 | A1 | 5/2021 | Feurtado et al. |
| 2021/0175184 | A1 | 6/2021 | Hong et al. |
| 2022/0336311 | A1 | 10/2022 | Cheng et al. |
| 2022/0354014 | A1 | 11/2022 | Feurtado et al. |
| 2024/0055357 | A1* | 2/2024 | Harada ............... H01L 23/3672 |

FOREIGN PATENT DOCUMENTS

| JP | 2021-141172 | A | 9/2021 |
| JP | 7034043 | B2 | 3/2022 |
| JP | 2022-152703 | A | 10/2022 |

* cited by examiner

FIG. 23

SEMICONDUCTOR DEVICE FOR UPPER AND LOWER ARM CIRCUITS

CROSS REFERENCE TO RELATED APPLICATION

This application is based on Japanese Patent Application No. 2022-176590 filed on Nov. 2, 2022, the disclosure of which is incorporated herein by reference.

TECHNICAL FIELD

The present disclosure relates to a semiconductor device.

BACKGROUND

JP 2015-186438 A discloses a semiconductor device used for upper and lower arm circuits. The disclosure contents of JP 2015-186438 A are incorporated herein by reference to explain technical elements presented herein.

SUMMARY

According to an aspect of the present disclosure, a semiconductor device for upper and lower arm circuits of at least one phase includes semiconductor elements, a first wiring, a second wiring, a clip, and a third wiring. Each of the semiconductor elements has a first element for one arm of the upper and lower arm circuits and a second element for another arm of the upper and lower arm circuits, and has a first main electrode provided on one surface and a second main electrode provided on a back surface opposite to the one surface in a thickness direction. The first wiring includes: a first mounting portion on which the first element is disposed and to which the first main electrode of the first element is connected; and a first power supply terminal portion continuous with the first mounting portion. The second wiring includes: a second mounting portion on which the second element is disposed and to which the first main electrode of the second element is connected; and an output terminal portion continuous with the second mounting portion. The clip electrically connects the second main electrode of the first element and the second mounting portion. The third wiring includes: a connection portion to which the second main electrode of the second element is connected; and a second power supply terminal portion continuous with the connection portion. The third wiring extends in parallel with the first wiring and the clip.

BRIEF DESCRIPTION OF DRAWINGS

FIG. 23 is a diagram illustrating another modification.

DETAILED DESCRIPTION

Figure 1:
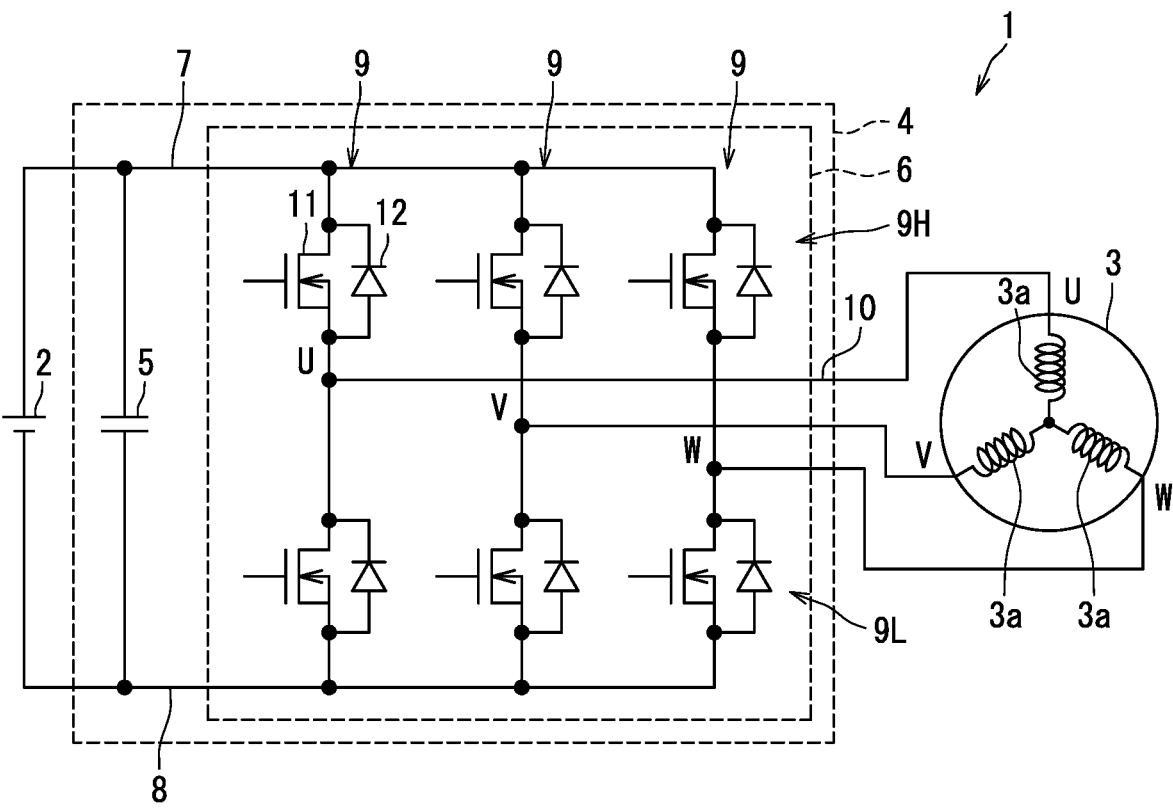
FIG. 1 is a diagram illustrating a circuit configuration of a power conversion device to which a semiconductor device according to a first embodiment is applied.

A semiconductor device is used for upper and lower arm circuits.

When the inductance of the upper and lower arm circuit is large, a surge voltage generated at the time of switching becomes large. Although it is possible to lower the surge voltage by limiting the switching speed, the switching loss increases.

The inductance is reduced by a parallel arrangement of a positive electrode terminal and a negative electrode terminal, which are power supply terminals, and a parallel arrangement of a coupling portion connecting the power supply terminal and a corresponding heat sink. However, a further reduction in inductance is desired. From the above-described viewpoint or from other viewpoints not mentioned, further improvement is required for the semiconductor device.

The present disclosure provides a semiconductor device that can reduce inductance.

According to an aspect of the present disclosure, a semiconductor device for upper and lower arm circuits of at least one phase includes semiconductor elements, a first wiring, a second wiring, a clip, and a third wiring. Each of the semiconductor elements has a first element for one arm of the upper and lower arm circuits and a second element for another arm of the upper and lower arm circuits, and has a first main electrode provided on one surface and a second main electrode provided on a back surface opposite to the one surface in a thickness direction. The first wiring includes: a first mounting portion on which the first element is disposed and to which the first main electrode of the first element is connected; and a first power supply terminal portion continuous with the first mounting portion. The second wiring includes: a second mounting portion on which the second element is disposed and to which the first main electrode of the second element is connected; and an output terminal portion continuous with the second mounting portion. The clip electrically connects the second main electrode of the first element and the second mounting portion. The third wiring includes: a connection portion to which the second main electrode of the second element is connected; and a second power supply terminal portion continuous with the connection portion. The third wiring extends in parallel with the first wiring and the clip.

According to the disclosed semiconductor device, the clip is used for connection between the second main electrode of the first element and the second wiring including the output terminal portion. The third wiring including the second power supply terminal portion extends parallel to the clip as well as the first wiring including the first power supply terminal portion. That is, the third wiring also extends parallel to a wiring portion connecting the second main electrode of the first element and the connection point (midpoint) of the upper and lower arm circuits. The parallel arrangement described above can effectively reduce inductance in the upper and lower arm circuits.

Disclosed embodiments herein employ different technical means to achieve their respective objectives. The objectives, features, and effects disclosed herein are further clarified by reference to the subsequent detailed description and accompanying drawings.

Hereinafter, multiple embodiments will be described with reference to the drawings. The same or corresponding elements in the embodiments are assigned the same reference numerals, and descriptions thereof will not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

A semiconductor device according to the present embodiment is applicable to, for example, a power conversion device for a mobile object with a rotary electric machine as a drive source. The mobile object is, for example, an electric vehicle (BEV), a hybrid vehicle (HEV), a plug-in hybrid vehicle (PHEV), a flying object such as an electric vertical take-off and landing aircraft or a drone, a ship, a construction machine, or an agricultural machine. Hereinafter, a semiconductor device is applied to a vehicle.

First Embodiment

First, a schematic configuration of a drive system of a vehicle will be described with reference to FIG. 1.

<Vehicle Drive System>

As shown in FIG. 1, a drive system 1 for a vehicle is provided with a DC power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The power conversion device 4 performs electric power conversion between the DC power supply 2 and the motor generator 3.

<Power Conversion Device>

Next, a circuit configuration of the power conversion device 4 will be described with reference to FIG. 1. The power conversion device 4 includes a power conversion circuit. The power conversion device 4 according to the present embodiment includes a smoothing capacitor 5 and an inverter 6 which is a power conversion circuit.

The smoothing capacitor 5 mainly smooths the DC voltage supplied from the DC power supply 2. The smoothing capacitor 5 is connected to a P line 7 which is a power supply line on the high potential side and an N line 8 which is a power supply line on the low potential side. The P line 7 is connected to a positive electrode of the DC power supply 2, and the N line 8 is connected to a negative electrode of the DC power supply 2. The positive electrode of the smoothing capacitor 5 is connected to the P line 7 at a position between the DC power supply 2 and the inverter 6. The negative electrode of the smoothing capacitor 5 is connected to the N line 8 at a position between the DC power supply 2 and the inverter 6. The smoothing capacitor 5 is connected to the DC power supply 2 in parallel.

The inverter 6 corresponds to a DC-AC conversion circuit. The inverter 6 converts the DC voltage into a three-phase AC voltage according to the switching control by the control circuit (not shown) and outputs the three-phase AC voltage to the motor generator 3. Thereby, the motor generator 3 is driven to generate a predetermined torque. At the time of regenerative braking of the vehicle, the inverter 6 converts the three-phase AC voltage generated by the motor generator 3 by receiving the rotational force from wheels into a DC voltage according to the switching control by the control circuit, and outputs the DC voltage to the P line. In this way, the inverter 6 performs bidirectional power conversion between the DC power supply 2 and the motor generator 3.

The inverter 6 includes upper and lower arm circuits 9 for three phases. The upper and lower arm circuits 9 are also referred to as leg. The upper and lower arm circuits 9 have an upper arm 9H and a lower arm 9L. The upper arm 9H and the lower arm 9L are connected in series between the P line 7 and the N line 8 with the upper arm 9H adjacent to the P line 7. A connection point between the upper arm 9H and the lower arm 9L is connected to the winding 3a of the corresponding phase in the motor generator 3 via an output line 10. The inverter 6 has six arms. Each arm includes a switching element. At least a part of the P line 7, the N line 8 and the output line 10 is made of a conductive member such as a bus bar.

In the present embodiment, an n-channel MOSFET 11 is employed as a switching element constituting each arm. The number of switching elements constituting each arm is not particularly limited. The number thereof may be one or more. MOSFET is an abbreviation for Metal Oxide Semiconductor Field Effect Transistor.

As an example, in the present embodiment, each arm includes one MOSFET 11. In the upper arm 9H, the drain of the MOSFET 11 is connected to the P line 7. In the lower arm 9L, the source of the MOSFET 11 is connected to the N line 8. The source of the MOSFET 11 in the upper arm 9H and the drain of the MOSFET 11 in the lower arm 9L are connected to each other.

A freewheeling diode 12 is connected in anti-parallel to each of the MOSFETs 11. The diode 12 may be a parasitic diode (i.e., a body diode) of the MOSFET 11 or may be provided separately from the parasitic diode. The anode of the diode 12 is connected to the source of the corresponding MOSFET 11, and the cathode thereof is connected to the drain.

The power conversion device 4 may further include a converter as a power conversion circuit. The converter is a DC-DC conversion circuit that converts a DC voltage into a DC voltage of a different value, for example. The converter is provided between the DC power supply 2 and the smoothing capacitor 5. The converter includes, for example, a reactor and the above-described upper and lower arm circuits 9. This configuration can boost/suppress voltage. The power conversion device 4 may further include a filter capacitor for removing power supply noise from the DC power supply 2. The filter capacitor is provided between the DC power supply 2 and the converter.

The power conversion device 4 may include a drive circuit for switching elements of the inverter 6. The drive circuit supplies a drive voltage to the gate of the MOSFET 11 of the corresponding arm based on the drive command of the control circuit. The drive circuit drives the corresponding MOSFET 11 by applying a drive voltage to turn on and off the drive of the corresponding MOSFET 11. The drive circuit may be referred to as a "driver".

The power conversion device 4 may include a control circuit for the switching element. The control circuit generates a drive command for operating the MOSFET 11 and outputs the drive command to the drive circuit. The control circuit generates a drive command based on a torque request input from a higher-level ECU (not illustrated) and signals detected by various sensors. ECU is an abbreviation of Electronic Control Unit.

Various sensors include, for example, a current sensor, a rotation angle sensor, and a voltage sensor. The current sensor detects the phase current flowing through the winding 3a of each phase. The rotation angle sensor detects a rotation angle of a rotor of the motor generator 3. The voltage sensor detects the voltage across the smoothing capacitor 5. The control circuit outputs, for example, a PWM signal as the drive command. The control circuit includes, for example, a processor and a memory. PWM is an Abbreviation for Pulse Width Modulation.

<Semiconductor device>

Figure 2:
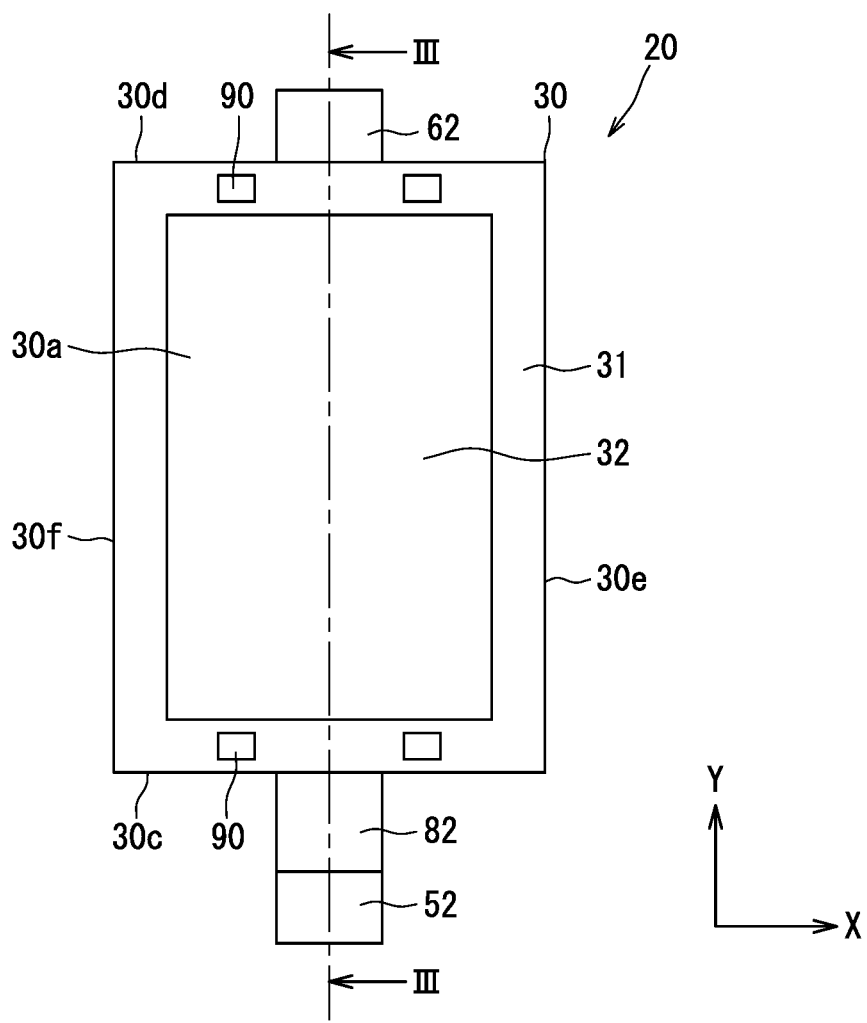
FIG. 2 is a plan view illustrating the semiconductor device.
Figure 3:
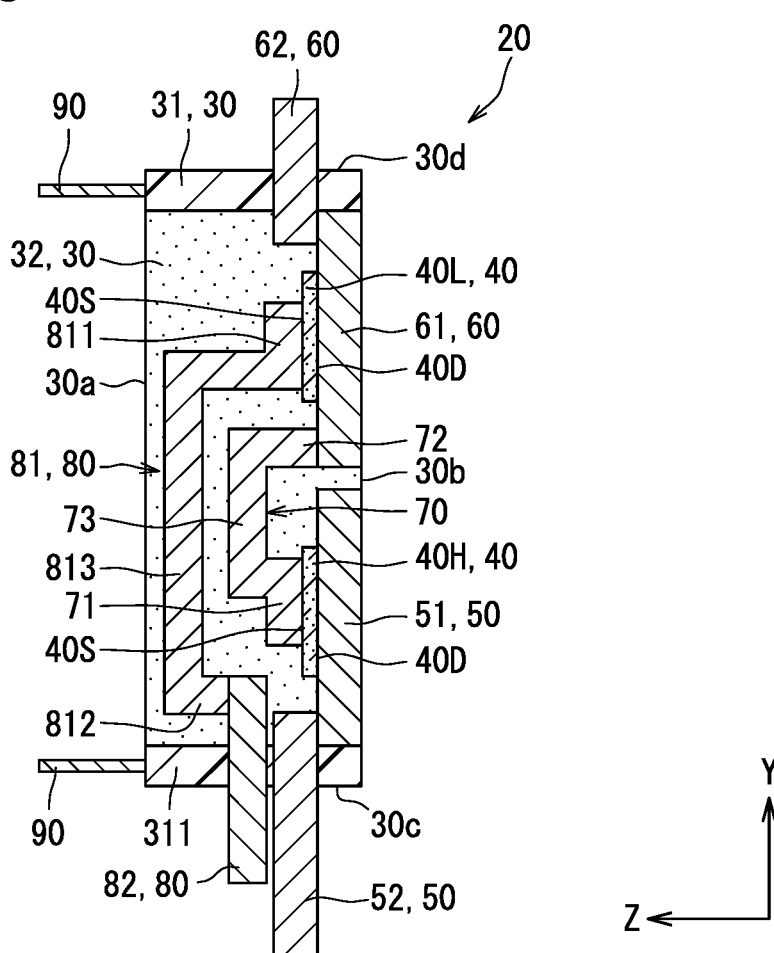
FIG. 3 is a cross-sectional view taken along line III-Ill of FIG. 2.
Figure 4:
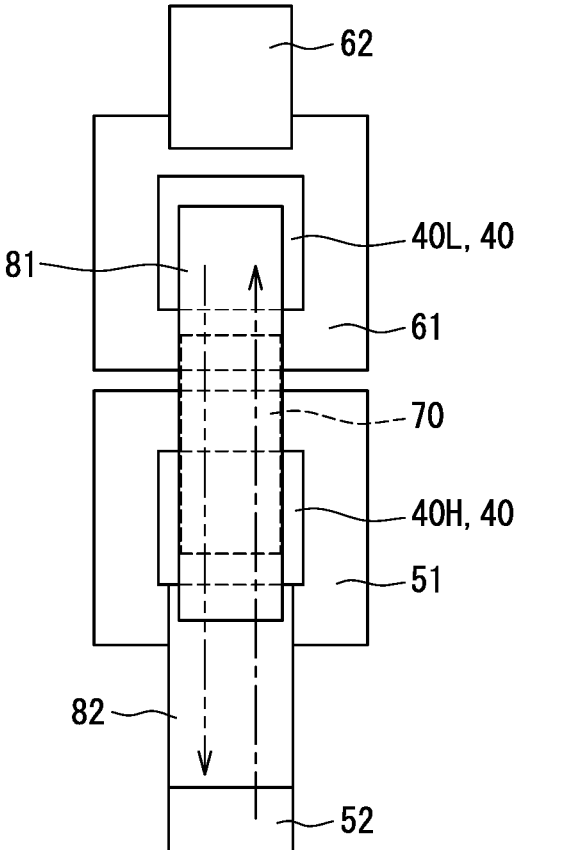
FIG. 4 is a view in which a sealing body is omitted from FIG. 2.
Figure 4:
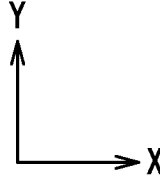

Next, a schematic configuration of the semiconductor device will be described with reference to FIGS. 2 to 4. FIG. 2 is a plan view illustrating the semiconductor device. FIG. 2 is a plan view of the semiconductor device in a top view. FIG. 3 is a cross-sectional view taken along line III-Ill of FIG. 2. FIG. 4 shows a state in which the sealing body and the signal terminal are omitted from FIG. 2.

Hereinafter, the thickness direction of the semiconductor element (semiconductor substrate) is defined as Z direction, and the arrangement direction of the semiconductor element of the upper arm and the semiconductor element of the lower arm is defined as Y direction. A direction orthogonal to both the Z direction and the Y direction is defined as X direction. Unless otherwise specified, a shape viewed in a plane perpendicular to the Z-direction, that is, a shape along an XY plane defined by the X-direction and Y-direction is referred to as a planar shape. A plan view in the Z direction may be simply referred to as a plan view.

As shown in FIGS. 2, 3, and 4, the semiconductor device 20 includes a sealing body 30, plural semiconductor elements 40, a first wiring 50, a second wiring 60, a clip 70, a third wiring 80, and a signal terminal 90. The semiconductor device 20 constitutes the upper and lower arm circuits 9 for at least one phase. As an example, the semiconductor device 20 of the present embodiment constitutes the upper and lower arm circuits 9 for one phase.

The sealing body 30 seals part of other elements of the semiconductor device 20. The rest of other elements are exposed to the outside of the sealing body 30. The sealing body 30 is made of, for example, resin or gel. As an example, the sealing body 30 of the present embodiment includes a case 31 which is a primary molded body using a resin, and a gel 32. The case 31 has a cylindrical shape that is open at both ends in the Z direction. The case 31 has a side wall 311 having a substantially rectangular annular shape in a plan view. The gel 32 is filled in the accommodation space of the case 31. The gel 32 fills the free area of the accommodation space. The filler is not limited to the gel 32. For example, a resin may be potted to fill the accommodation space.

As shown in FIG. 2, the sealing body 30 has a substantially rectangular shape in plan view. The sealing body 30 has one surface 30a and a back surface 30b, which is a surface opposite to the one surface 30a in the Z direction, as the outer surface. The one surface 30a and the back surface 30b are, for example, flat surfaces. As an example, the one surface 30a of the present embodiment is a surface from which the signal terminal 90 protrudes. The outer peripheral portions of the one surface 30a and the back surface 30b are configured by the case 31, and the central portion is configured by the gel 32.

The sealing body 30 has side surfaces 30c, 30d, 30e, and 30f that connect the one surface 30a and the back surface 30b. The side surface 30c is a surface from which the positive electrode terminal 52 and the negative electrode terminal 82, which are main terminals, protrude. The side surface 30d is a surface opposite to the side surface 30c in the Y direction. The side surface 30d is a surface from which the output terminal 62 as the main terminal protrudes. The side surface 30e is a surface opposite to the side surface 30f in the X direction.

The semiconductor element 40 includes a vertical element formed on a semiconductor substrate made of material such as silicon or wide bandgap semiconductor having a wider bandgap than silicon. Examples of the wide bandgap semiconductor include silicon carbide (SiC), gallium nitride (GaN), gallium oxide ($Ga_2O_3$), and diamond. The semiconductor element 40 may be referred to as a power element or a semiconductor chip.

The vertical element is configured to cause a main current to flow in the thickness direction of the semiconductor element 40 (semiconductor substrate), that is, in the Z direction. The semiconductor element 40 has main electrodes on both sides in the Z direction, which is the thickness direction of the semiconductor element. The semiconductor element 40 of the present embodiment is formed by forming an n-channel MOSFET 11 as a vertical element on a semiconductor substrate made of SiC. The semiconductor element 40 includes, as a main electrode, a drain electrode 40D on one surface, and a source electrode 40S on a back surface opposite to the one surface in the Z direction. In the present embodiment, the drain electrode 40D corresponds to a first main electrode, and the source electrode 40S corresponds to a second main electrode.

When the MOSFET 11 is turned on, a current (main current) flows between the main electrodes, that is, between the drain electrode 40D and the source electrode 40S. When the diode 12 is a parasitic diode, the source electrode 40S also serves as an anode electrode, and the drain electrode 40D also serves as a cathode electrode. The diode 12 may be configured on a separate chip from the MOSFET 11. The drain electrode 40D is a main electrode on the high potential side, and the source electrode 40S is a main electrode on the low potential side. The drain electrode 40D is formed in substantially the entire region of the back surface. The source electrode 40S is formed on a part of the one surface.

The semiconductor element 40 has a substantially rectangular shape in a plane. Although not illustrated, the semiconductor element 40 has a pad serving as a signal electrode on the back surface. The pad is formed at a position different from that of the source electrode 40S on the back surface. The pad includes at least a gate pad.

The semiconductor elements 40 include a semiconductor element 40H for the upper arm 9H and a semiconductor element 40L for the lower arm 9L. The semiconductor element 40H may be referred to as an upper arm element. The semiconductor element 40L may be referred to as a lower arm element. For example, the configurations of the semiconductor elements 40H and 40L are common to each other. In the present embodiment, the semiconductor element 40H corresponds to a first element, and the semiconductor element 40L corresponds to a second element.

As an example, as shown in FIGS. 3 and 4, the semiconductor element 40 of the present embodiment includes one semiconductor element 40H and one semiconductor element 40L. The semiconductor elements 40H and 40L are arranged in the Y direction. The semiconductor elements 40H and 40L are arranged at substantially the same position in the Z-direction. The semiconductor elements 40H and 40L are arranged to have the same orientation so that the source electrode 40S is located to face the one surface 30a and the drain electrode 40D is located to face the back surface 30b.

The first wiring 50 is electrically connected to the first main electrode of the first element. As an example, the first wiring 50 of the present embodiment is electrically connected to the drain electrode 40D of the semiconductor element 40H. That is, the first wiring 50 is electrically connected to the positive electrode of the smoothing capacitor 5. The first wiring 50 may be referred to as a P wiring, a positive electrode wiring, a P conductor, a positive electrode conductor, or the like.

The first wiring 50 is a metal plate material made of a metal having good conductivity such as Cu or a Cu alloy. The metal plate may be provided, for example, as part of a lead frame. Instead of the metal plate material, a metal body (metal pattern) disposed on an insulating base material made of ceramic or resin may be adopted. That is, it may be provided as a part of the substrate. The substrate may be a single-sided substrate in which a metal body is disposed on one surface of an insulating base material, or may be a double-sided substrate in which a metal body is disposed on both surfaces of an insulating base material. The surface of the first wiring 50 may be provided with a plating film of Ni, Au, or the like.

As an example, the first wiring 50 of the present embodiment includes a heat sink 51 and a positive electrode terminal 52. The heat sink 51 has a substantially rectangular shape in plane. The heat sink 51 includes and surrounds the semiconductor element 40H in a plan view. One surface of the heat sink 51 is a mounting surface on which the semiconductor element 40H is disposed. The drain electrode 40D of the semiconductor element 40H is connected to the one surface of the heat sink 51 via a bonding material (not shown) such as solder. The back surface of the heat sink 51 is exposed from the back surface 30b of the sealing body 30. The back surface of the heat sink 51 is a heat dissipation surface. The heat sink 51 provides a wiring function of electrically connecting the positive electrode terminal 52 and the semiconductor element 40H. The heat sink 51 provides a heat dissipation function of dissipating heat generated by the semiconductor element 40. The heat sink 51 corresponds to a first mounting portion.

The positive electrode terminal 52 is connected to the heat sink 51. The positive electrode terminal 52 may be connected to the heat sink 51 by being continuously and integrally provided, or may be provided as a separate member and connected by bonding. As an example, the positive electrode terminal 52 of the present embodiment is connected to the heat sink 51 by bonding. The positive electrode terminal 52 is joined to one end of one surface of the heat sink 51 in the Y direction. The positive electrode terminal 52 is joined not to the end of the heat sink 51 close to the heat sink 61 but to the end of the heat sink 51 away from the heat sink 61.

The positive electrode terminal 52 extends in the Y direction. The positive electrode terminal 52 is held by the case 31. The positive electrode terminal 52 is formed integrally with the case 31. A part of the positive electrode terminal 52 is disposed in the accommodation space of the case 31 and is joined to the heat sink 51. The other part of the positive electrode terminal 52 protrudes outward of the case 31. A conductive member (not shown) such as a bus bar constituting the P line 7 is connected to a portion of the positive electrode terminal 52 outside the case. The positive electrode terminal 52 may be referred to as a high potential power supply terminal, a P terminal, or the like. The positive electrode terminal 52 corresponds to a first power supply terminal.

The second wiring 60 is electrically connected to the first main electrode of the second element. As an example, the second wiring 60 of the present embodiment is electrically connected to the drain electrode 40D of the semiconductor element 40L.

The second wiring 60 is a metal plate material made of a metal having good conductivity such as Cu or a Cu alloy. The metal plate may be provided, for example, as part of a lead frame. Instead of the metal plate material, a metal body (metal pattern) disposed on an insulating base material may be adopted. That is, it may be provided as a part of the substrate. The substrate may be a single-sided substrate or a double-sided substrate. The surface of the second wiring 60 may be provided with a plating film of Ni, Au, or the like.

As an example, the second wiring 60 of the present embodiment includes a heat sink 61 and an output terminal 62. The heat sink 61 has a substantially rectangular shape in plane. The heat sink 61 includes and surrounds the semiconductor element 40L in a plan view. One surface of the heat sink 61 is a mounting surface on which the semiconductor element 40L is disposed. The drain electrode 40D of the semiconductor element 40L is connected to the one surface of the heat sink 61 via a bonding material (not shown) such as solder. The back surface of the heat sink 61 is exposed from the back surface 30b of the sealing body 30. The back surface of the heat sink 61 is a heat dissipation surface. The heat sink 61 provides a wiring function of electrically connecting the output terminal 62 and a connection point (midpoint) of the upper and lower arm circuits 9. The heat sink 61 provides a wiring function of electrically connecting the source electrode 40S of the semiconductor element 40H and the connection point of the upper and lower arm circuits 9. The heat sink 61 provides a heat dissipation function of dissipating heat generated by the semiconductor element 40L.

The heat sink 61 is arranged side by side with the heat sink 51 in the Y direction. The heat sink 61 has, for example, a planar shape substantially matching the heat sink 51. The heat sink 61 corresponds to a second mounting portion.

The output terminal 62 is connected to the heat sink 61. The output terminal 62 may be connected to the heat sink 61 by being continuously and integrally provided, or may be provided as a separate member and connected by bonding. As an example, the output terminal 62 of the present embodiment is connected to the heat sink 61 by bonding. The output terminal 62 is joined to one end of one surface of the heat sink 61 in the Y direction. The output terminal 62 is joined not to the end of the heat sink 61 close to the heat sink 51 but to the end of the heat sink 61 away from the heat sink 51. With the above-described arrangement, the junction with the semiconductor element 40L in the heat sink 61 provides a connection point of the upper and lower arm circuits 9.

The output terminal 62 extends in the Y direction. The output terminal 62 extends away from the positive electrode terminal 52 in the Y direction. The output terminal 62 is held by the case 31. The output terminal 62 is formed integrally with the case 31. A part of the output terminal 62 is disposed in the accommodation space of the case 31 and is joined to the heat sink 61. Another part of the output terminal 62 protrudes outward of the case 31. The winding 3*a* of the corresponding phase of the motor generator 3 is electrically connected to a portion outside the case of the output terminal 62. The output terminal 62 may be referred to as an O terminal, an AC terminal, or the like. The output terminal 62 corresponds to an output terminal portion.

The clip 70 electrically connects the second main electrode of the first element and the second mounting portion. As an example, the clip 70 of the present embodiment electrically connects the source electrode 40S of the semiconductor element 40H and the heat sink 61 of the second wiring 60. The clip 70 provides at least a part of the wiring that electrically connects the source electrode 40S of the semiconductor element 40H and the connection point of the upper and lower arm circuits 9. The clip 70 may be referred to as a bridging member, a relay member, a metal bridge, or the like. The clip 70 is a metal plate material made of a metal having good conductivity such as Cu or a Cu alloy. The clip 70 may include a plating film of Ni, Au, or the like on the surface thereof.

The clip 70 extends in the Y direction in a plan view. The clip 70 has end portions 71 and 72 and a connecting portion 73. The end portion 71 is one end of the clip 70. The end portion 71 is bonded to the source electrode 40S of the semiconductor element 40H via a bonding material (not shown). The end portion 72 is another end of the clip 70. The end portion 72 is joined to one end of one surface of the heat sink 61 in the Y direction. The end portion 72 is joined to an end portion of the heat sink 61 closer to the heat sink 51. The connecting portion 73 electrically connects the end portions 71 and 72 to each other, at location above and away from the heat sink 51, 61. The clip 70 is disposed in the accommodation space of the case 31.

The third wiring 80 is electrically connected to the second main electrode of the second element. As an example, the third wiring 80 of the present embodiment is electrically connected to the source electrode 40S of the semiconductor element 40L. That is, the third wiring 80 is electrically connected to the negative electrode of the smoothing capacitor 5. The third wiring 80 may be referred to as an N wiring, a negative electrode wiring, an N conductor, a negative electrode conductor, or the like. The third wiring 80 is a metal plate material made of a metal having good conductivity such as Cu or a Cu alloy. The surface of the third wiring 80 may be provided with a plating film of Ni, Au, or the like.

As an example, the third wiring 80 of the present embodiment includes a clip 81 and a negative electrode terminal 82. The clip 81 electrically connects the source electrode 40S of the semiconductor element 40L and the negative electrode terminal 82. The clip 81 corresponds to a connection portion. The clip 81 may be referred to as a bridging member, a relay member, a metal bridge, or the like. The clip 81 extends in the Y direction in a plan view. The clip 81 has end portions 811, 812 and a connecting portion 813.

The end portion 811 is one end of the clip 81. The end portion 811 is bonded to the source electrode 40S of the semiconductor element 40L via a bonding material (not shown). The end portion 812 is another end of the clip 81. The end portion 812 is joined to the negative electrode terminal 82. The connecting portion 813 electrically connects the end portions 71 and 72 to each other at location above and away from the heat sink 51, 61. The clip 81 is disposed in the accommodation space of the case 31.

The negative electrode terminal 82 is connected to the clip 81. The negative electrode terminal 82 may be connected to the clip 81 by being provided continuously and integrally with the clip, or may be provided as a separate member and connected by bonding. As an example, the negative electrode terminal 82 of the present embodiment is connected to the clip 81 by bonding. The negative electrode terminal 82 is joined to the end portion 812 of the clip 81.

The negative electrode terminal 82 extends in the Y direction. The negative electrode terminal 82 is held by the case 31. The negative electrode terminal 82 is formed integrally with the case 31. A part of the negative electrode terminal 82 is disposed in the accommodation space of the case 31 and is joined to the clip 81. Another part of the negative electrode terminal 82 protrudes outward of the case 31. A conductive member (not shown) such as a bus bar constituting the N line 8 is connected to a portion outside the case of the negative electrode terminal 82. The negative electrode terminal 82 may be referred to as a low potential power supply terminal, an N terminal, or the like. The negative electrode terminal 82 corresponds to a second power supply terminal.

The signal terminal 90 is electrically connected to the pad of the corresponding semiconductor element 40. As an example, the signal terminal 90 of the present embodiment is held by the case 31. The signal terminal 90 is formed integrally with the case 31. The signal terminal 90 extends in the Z direction. One end portion of the signal terminal 90 protrudes upward from the upper end of the case 31, that is, the one surface 30*a*. The other end portion of the signal terminal 90, which is connected to the pad, is exposed to the accommodation space of the case 31. The exposed portion of the signal terminal 90 is electrically connected to the pad of the corresponding semiconductor element 40 via a connection member (not shown) such as a bonding wire.

As described above, in the semiconductor device 20 according to the present embodiment, the semiconductor elements 40 of the upper and lower arm circuits 9 for one phase are sealed by the sealing body 30. The sealing body 30 integrally seals the semiconductor elements 40, a part of the first wiring 50, a part of the second wiring 60, the clip 70, a part of the third wiring 80, and a part of the signal terminal 90.

The semiconductor element 40H is disposed on the heat sink 51 of the first wiring 50. The semiconductor element 40L is disposed on the heat sink 61 of the second wiring 60. Accordingly, heat of the semiconductor element 40H, 40L can be radiated through the corresponding heat sink 51, 61. For example, the heat dissipation surface of the heat sink 51, 61 is substantially flush with the back surface 30*b* of the sealing body 30. Since the heat dissipation surface is an exposed surface, heat dissipation can be enhanced.

<Semiconductor Module>

Figure 5:
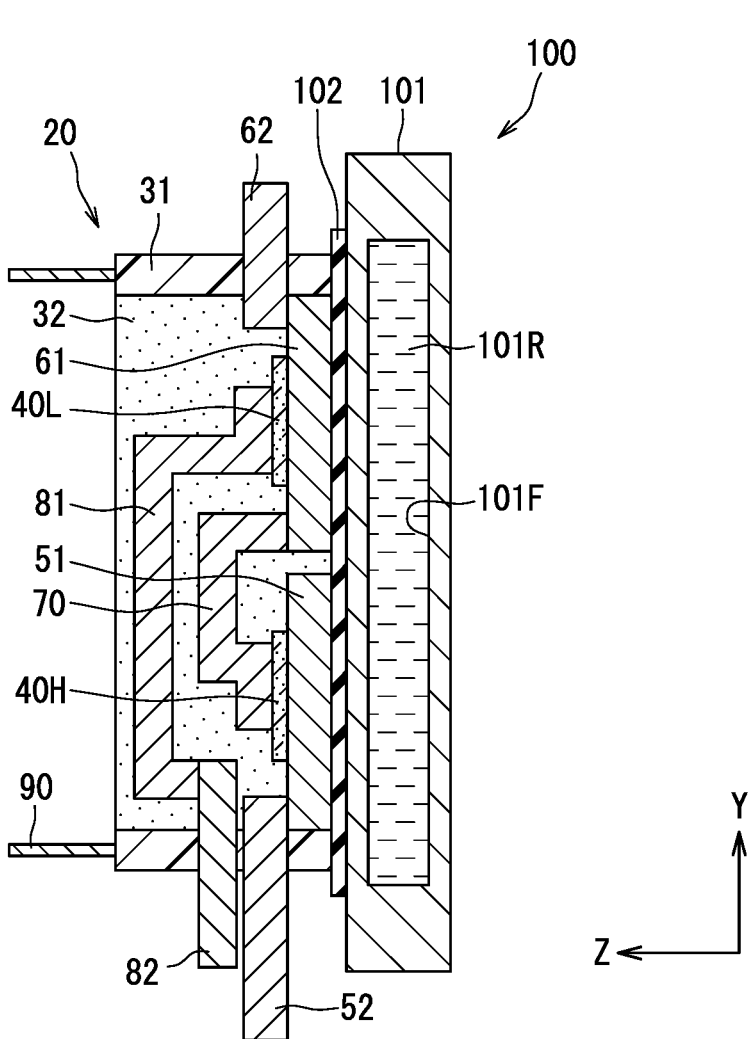
FIG. 5 is a sectional view showing a semiconductor module.

FIG. 5 is a sectional view showing the semiconductor module. FIG. 5 corresponds to FIG. 3. As shown in FIG. 5, the semiconductor module 100 includes the semiconductor device 20 and the cooler 101.

The semiconductor device 20 is disposed on one surface of the cooler 101 in the Z direction. The cooler 101 includes a flow path 101F. The cooler 101 cools the semiconductor device 20 from the back surface 30b. The flow path 101F is provided so as to overlap at least a part of the semiconductor device 20 in a plan view so as to effectively cool the semiconductor device 20. The flow path 101F of the present embodiment is provided so as to enclose and overlap most of the semiconductor device 20 in a plan view.

The refrigerant 101R is supplied to the flow path 101F through an introduction pipe (not shown). The refrigerant 101R flowing through the flow path 101F is discharged to the outside of the cooler 101 through a discharge pipe (not shown). As the refrigerant 101R, a phase-changing refrigerant such as water or ammonia can be used, or a non-phase-changing refrigerant such as ethylene glycol can be used.

An electrically insulating member is disposed between the semiconductor device 20 and the cooler 101 as necessary. As an example, the semiconductor module 100 of the present embodiment includes an insulating member 102 such as ceramic plate or resin sheet. To increase thermal conductivity, a thermal interface material (TIM) such as silicone gel may be employed.

<Manufacturing Method>

Next, an example of a method of manufacturing the semiconductor device 20 will be described.

First, the case 31 in which the positive electrode terminal 52, the output terminal 62, the negative electrode terminal 82, and the signal terminal 90 are integrally molded is prepared. Further, other elements constituting the semiconductor device 20, specifically, the semiconductor element 40, the heat sink 51, 61, and the clip 70, 81 are prepared.

The heat sink 51, 61 is disposed along the back surface 30b at the end portion in the case 31. The heat sink 51 and the positive electrode terminal 52 are joined together in the case 31. Similarly, the heat sink 61 and the output terminal 62 are joined.

The semiconductor element 40H is disposed on one surface of the heat sink 51, and the drain electrode 40D and the heat sink 51 are bonded to each other. Similarly, the semiconductor element 40L is disposed on one surface of the heat sink 61, and the drain electrode 40D and the heat sink 61 are bonded to each other.

The clip 70 is disposed in the accommodation space of the case 31. The end portion 71 is bonded to the source electrode 40S of the semiconductor element 40H. The end portion 72 is joined to the heat sink 61.

The clip 81 is disposed in the accommodation space of the case 31. The end portion 811 is bonded to the source electrode 40S of the semiconductor element 40L, and the end portion 812 is bonded to the negative electrode terminal 82.

The signal terminal 90 is electrically connected to the corresponding pad of the semiconductor element 40. The accommodation space of the case 31 is filled with the gel 32 to obtain the semiconductor device 20 having the above-described configuration. When the gel 32 is filled, the gel may be filled in a state in which the back surface 30b is closed. For example, the gel 32 may be filled in a state where the case 31 is disposed on the cooler 101. The gel 32 may be filled in a state of being closed by the insulating member 102.

The connection between the signal terminal 90 and the pad is not limited to the timing described above. This is possible after the drain electrode 40D of the semiconductor element 40 and the corresponding heat sink 51, 61 are bonded to each other.

<Parallel Arrangement>

Figure 6:
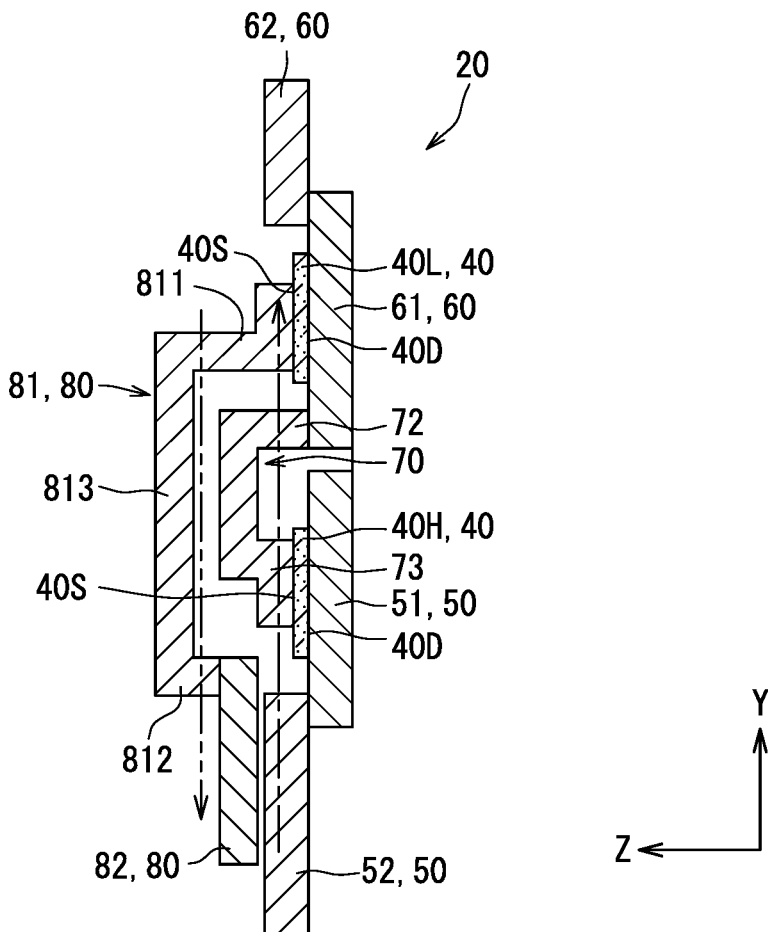
FIG. 6 is a view in which a sealing body is omitted from FIG. 3.

Next, the parallel arrangement of the wirings will be described with reference to FIGS. 4 and 6. FIG. 6 shows a state in which the sealing body and the signal terminal are omitted from FIG. 3. In FIGS. 4 and 6, the current flowing from the positive electrode terminal 52 toward the connection point of the upper and lower arm circuits 9 is indicated by a single-dotted arrow, and the current flowing from the connection point toward the negative electrode terminal 82 is indicated by a double-dotted arrow. In the following description, a parallel arrangement of two elements refers to a state in which the facing arrangement having a predetermined interval between the two elements continues over a predetermined range along the extending direction.

As described above, the semiconductor elements 40H and 40L are arranged side by side in the Y direction. The semiconductor elements 40H and 40L are arranged in a row along the Y direction. The heat sink 51 of the first wiring 50 and the heat sink 61 of the second wiring 60 are arranged side by side in the Y direction with a predetermined gap interposed therebetween. The positive electrode terminal 52 extends from the heat sink 51 in the Y direction away from the heat sink 61. The output terminal 62 extends from the heat sink 61 in the Y direction away from the positive electrode terminal 52.

The clip 70 electrically connects the source electrode 40S of the semiconductor element 40H disposed on the heat sink 51 to the heat sink 61. The clip 70 extends in the Y direction in a plan view. The third wiring 80 is electrically connected to the source electrode 40S of the semiconductor element 40L disposed on the heat sink 61. The negative electrode terminal 82 extends in the Y direction. The clip 81 extends in the Y direction in a plan view and electrically connects the semiconductor element 40L and the negative electrode terminal 82.

As shown in FIG. 4, the clip 81 is provided so as to overlap the clip 70 in a plan view. As an example, the clip 81 of the present embodiment has substantially the same width as the clip 70. The width is a length in the X direction orthogonal to the extending direction. The clip 81 is longer than the clip 70 in the Y direction. The clip 81 is disposed so as to substantially coincide with the clip 70 in the width direction (X direction). The clip 81 is disposed so as to overlap the entire region of the clip 70 in a plan view.

The majority of the clip 81 extends parallel to the clip 70. The remainder of the clip 81 extends alongside the heat sink 51, 61. The clip 81 extends in parallel with a portion of the heat sink 61, for example, from the bonding portion with the clip 70 to the bonding portion of the semiconductor element 40L. The clip 81 extends parallel to the wiring connecting the source electrode 40S of the semiconductor element 40H and the connection point of the upper and lower arm circuits 9. The facing distance between the clip 81 and the clip 70 is shorter than the facing distance between the clip 81 and the heat sink 51, 61. The clip 81 faces the clip 70 at a closer position than the heat sink 51, 61 in the Z direction. The clips 70 and 81 partially face each other in the Y direction. For example, the end portion 811 of the clip 81 faces the end portion 72 of the clip 70 in the Y direction.

The negative electrode terminal 82 is provided so as to overlap the positive electrode terminal 52 in a plan view. As an example, the negative electrode terminal 82 of the present embodiment has substantially the same width as the positive electrode terminal 52. The negative electrode terminal 82 is wider than the clip 81. The negative electrode terminal 82 is narrower than the heat sink 51. The negative electrode terminal 82 is disposed so as to substantially coincide with the positive electrode terminal 52 in the width direction.

As shown in FIGS. 4 and 6, the negative electrode terminal 82 is extended parallel to the first wiring 50 in its entire length. Most of the negative electrode terminal 82 is parallel to the positive electrode terminal 52. The remaining portion of the negative electrode terminal 82 extends parallel to the heat sink 51. The facing distance between the negative electrode terminal 82 and the positive electrode terminal 52 is shorter than the facing distance between the negative electrode terminal 82 and the heat sink 51. The negative electrode terminal 82 faces the positive electrode terminal 52 at a closer position than the heat sink 51 in the Z direction.

Summary of First Embodiment

As described above, in the semiconductor device 20 of the present embodiment, the clip 70 is used for connection between the source electrode 40S (second main electrode) of the semiconductor element 40H (first element) and the second wiring 60 including the output terminal 62 (output terminal portion). The third wiring 80 including the negative electrode terminal 82 (second power supply terminal portion) is arranged in parallel with not only the first wiring 50 including the positive electrode terminal 52 (first power supply terminal portion) but also the clip 70.

That is, the third wiring 80 runs in parallel with the wiring connecting the positive electrode terminal 52 to the junction between the semiconductor element 40L and the heat sink 61 providing the connection point for the upper and lower arm circuits 9. The third wiring 80 also runs parallel to the wiring portion connecting the source electrode 40S of the semiconductor element 40H and the connection point for the upper and lower arm circuits 9. Due to the parallel arrangement, the current flowing from the positive electrode terminal 52 toward the connection point for the upper and lower arm circuits 9 by turning on the MOSFET 11 of the semiconductor element 40H and the current flowing from the connection point toward the negative electrode terminal 82 by turning on the MOSFET 11 of the semiconductor element 40L are opposite to each other while facing each other. Therefore, it is possible to reduce the inductance in the upper and lower arm circuits 9 (main circuit) by the effect of canceling the magnetic flux generated by the current. This makes it possible to reduce a surge voltage generated at the time of switching.

Further, by using the clip 70, the wiring from the positive electrode terminal 52 to the connection point of the upper and lower arm circuits 9 approaches the wiring from the connection point to the negative electrode terminal 82, such that the PN current loop of the main circuit wiring becomes small. The PN current loop indicates a loop shape of a current path from the positive electrode terminal 52 (P terminal) to the negative electrode terminal 82 (N terminal) via the connection point of the upper and lower arm circuits 9. When the PN current loop is small, the wirings through which currents flow in opposite directions approach each other, and the effect of canceling the magnetic flux is enhanced, so that the inductance can be reduced.

Further, the heat generated by the semiconductor element 40H can be radiated to the outside of the semiconductor device 20 through the first wiring 50 (heat sink 51). Heat generated by the semiconductor element 40L can be radiated to the outside of the semiconductor device 20 via the second wiring 60 (heat sink 61). With the single-sided heat dissipation structure, the semiconductor device 20 can be reduced in size, that is, reduced in height in the Z direction.

The parallel arrangement distance between the third wiring 80 and the clip 70 is not particularly limited. By providing the third wiring 80 so as to run parallel to at least a part of the clip 70, the inductance can be reduced to some extent. As an example, in the present embodiment, the third wiring 80 extends in parallel over the entire length of the clip 70 in a plan view. Since the parallel arrangement distance is long, the inductance can be further reduced.

The parallel arrangement is not particularly limited. As an example, in the present embodiment, the third wiring 80 runs parallel to the first wiring 50 and the clip 70 while facing in the Z direction. That is, the plate surfaces face each other. Accordingly, the facing area can be increased, and the inductance can be effectively reduced.

As an example, in the present embodiment, the third wiring 80 includes the clip 81 and the negative electrode terminal 82. According to this, it is easy to adopt the sealing structure using the case 31. The clip 70 corresponds to a first clip, and the clip 81 corresponds to a second clip. The negative electrode terminal 82 corresponds to a terminal connected to the second clip.

(Modification)

Figure 7:
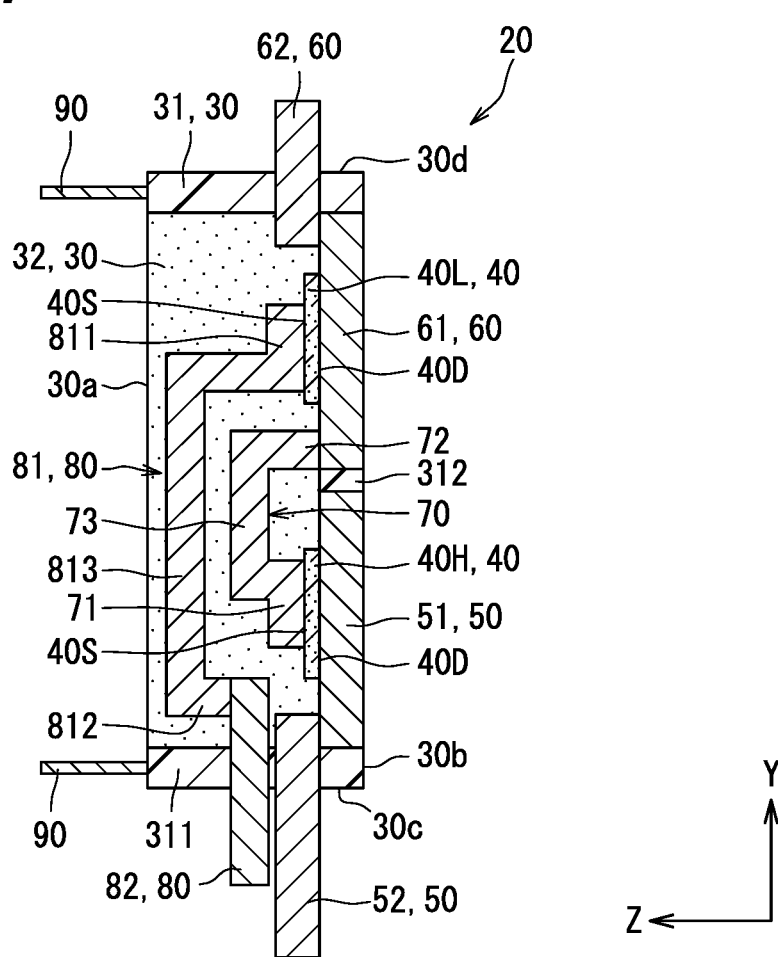
FIG. 7 is a diagram illustrating a modification.

The case 31 of the sealing body 30 is not limited to the structure described above. For example, as shown in FIG. 7, the case 31 may have a bottom wall 312 that closes one of the openings in the side wall 311. The heat sink 51, 61 is held by the bottom wall 312 (case 31) so that, for example, the one surface and the back surface are exposed.

Figure 8:
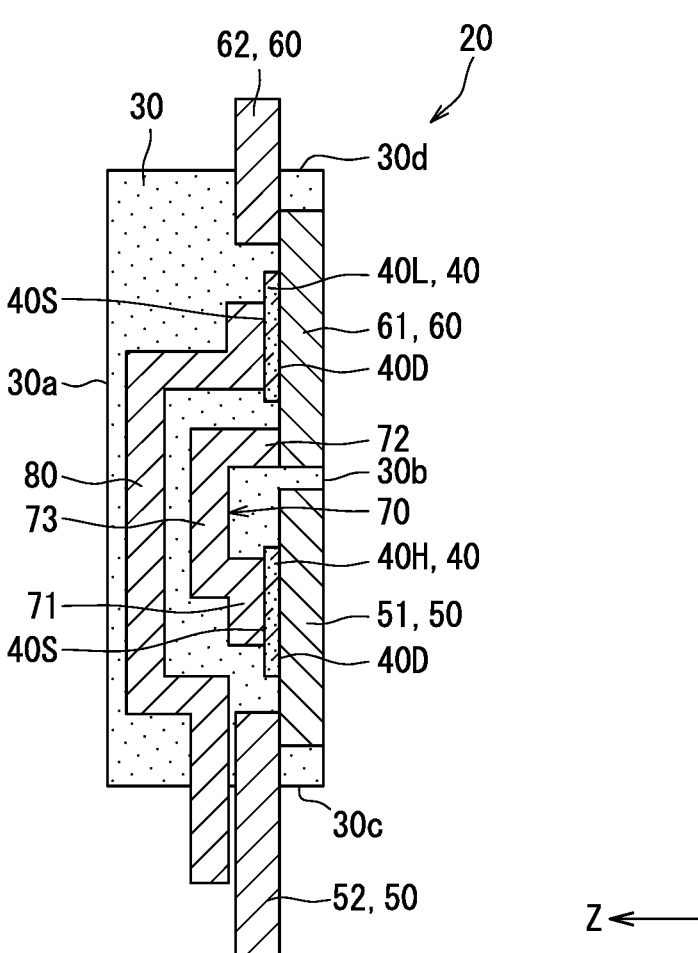
FIG. 8 is a diagram illustrating a modification.

The sealing body 30 is not limited to the configuration including the case 31. For example, as illustrated in FIG. 8, the entire sealing body 30 may be integrally molded. The sealing body 30 illustrated in FIG. 8 is molded by, for example, a transfer molding method using a resin as a material. An example of the resin is epoxy resin. Such a sealing body 30 may be referred to as a sealing resin body, a mold resin, or a resin molded body. For convenience, the illustration of the signal terminal 90 is omitted in FIG. 8.

As shown in FIG. 8, the third wiring 80 may have a configuration in which the connection portion and the second power supply terminal portion are continuously and integrally provided. As described above, the same applies to the first wiring 50 and the second wiring 60.

Second Embodiment

This embodiment is a modification based on the preceding embodiment, and the description of the preceding embodiment can be incorporated. In the preceding embodiment, the parallel arrangement also includes the facing arrangement facing each other in the Z direction. Alternatively, the parallel arrangement may include a facing arrangement facing each other in the width direction.

Figure 9:
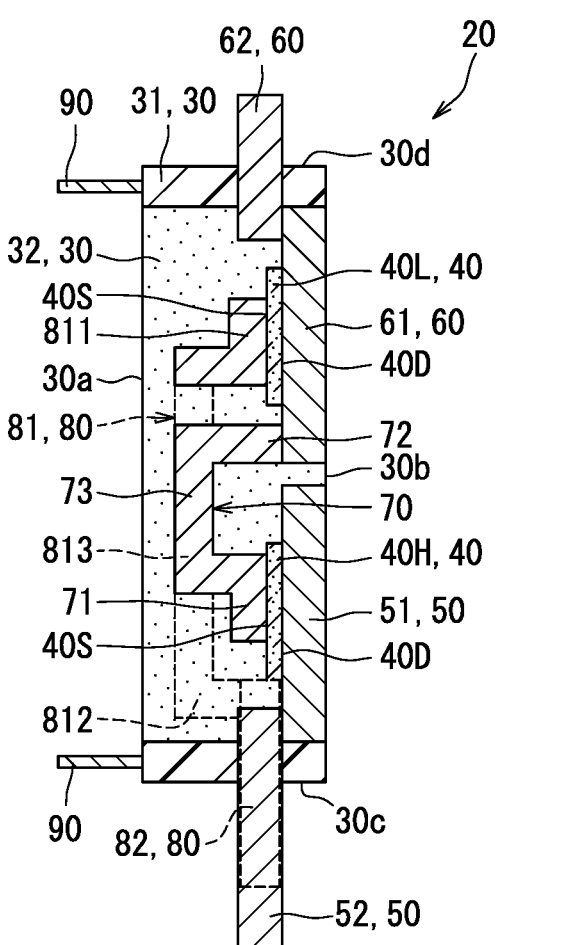
FIG. 9 is a sectional view illustrating a semiconductor device according to a second embodiment.
Figure 9:
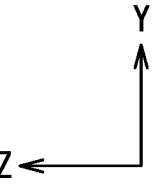
Figure 10:
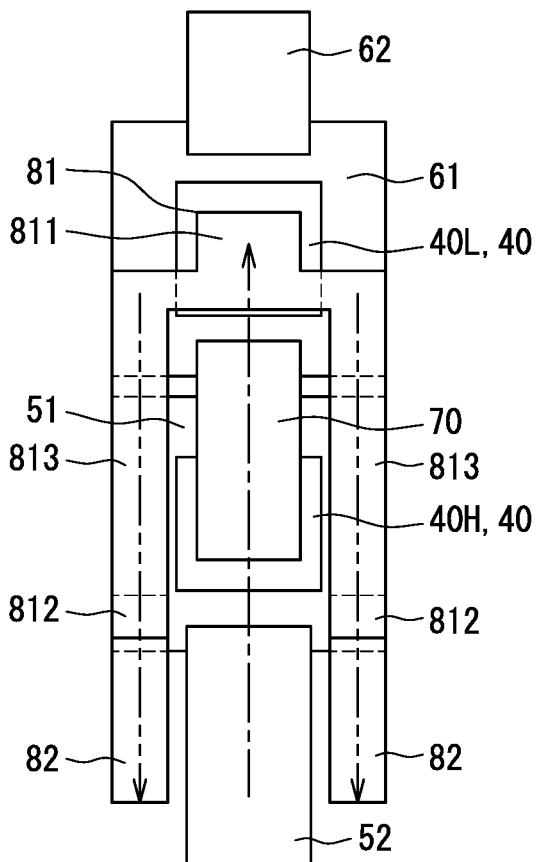
FIG. 10 is a plan view in which a sealing body is omitted.
Figure 10:
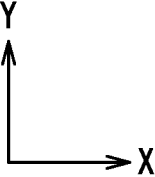
Figure 11:
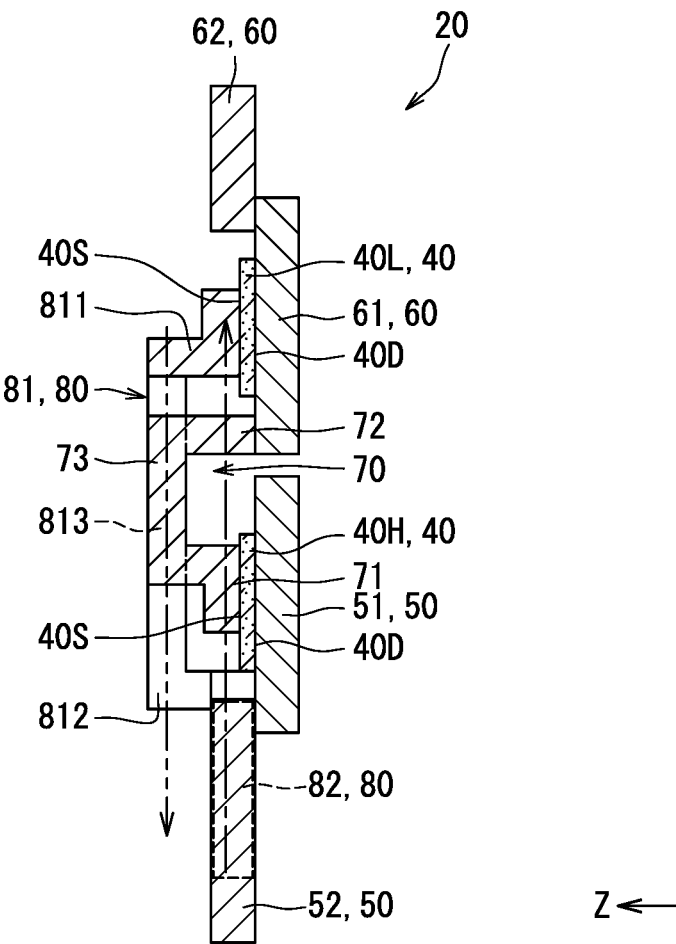
FIG. 11 is a view in which a sealing body is omitted from FIG. 9.

FIG. 9 is a sectional view illustrating the semiconductor device 20 according to the present embodiment. FIG. 9 corresponds to FIG. 3. FIG. 10 is a plan view illustrating a state in which the sealing body 30 is omitted. FIG. 10 corresponds to FIG. 4. FIG. 11 shows a state in which the sealing body 30 and the signal terminal 90 are omitted from FIG. 9. FIG. 11 corresponds to FIG. 6. In FIGS. 10 and 11, as in the preceding embodiment, the current flowing from the positive electrode terminal 52 toward the connection point of the upper and lower arm circuits 9 is indicated by the single-dotted arrow, and the current flowing from the connection point toward the negative electrode terminal 82 is indicated by the double-dotted arrow.

The semiconductor device 20 constitutes the upper and lower arm circuits 9 for one phase, similarly to the configuration described in the preceding embodiment. The semiconductor device 20 includes the sealing body 30, the semiconductor elements 40, the first wiring 50, the second wiring 60, the clip 70, the third wiring 80, and the signal terminal 90.

The third wiring 80 is disposed to face the first wiring 50 and the clip 70 not in the thickness direction but in the width direction (X direction). As an example, the clip 81 of the present embodiment has one end portion 811, two end portions 812, and two connecting portions 813. The end portion 811 is bonded to the source electrode 40S of the semiconductor element 40L. The two connecting portions 813 are connected to the common end portion 811. Each of the connecting portions 813 includes an X-direction extending portion extending in the X direction from the end portion 811 and a Y-direction extending portion extending in the Y direction. The clip 70 (connecting portion 73) is interposed between the two Y-direction extending portions in the X direction. The end portion 812 is provided at an end of the Y-direction extending portion.

As an example, the thickness of the clip 81 is substantially equal to that of the clip 70. The Y-direction extending portion of the connecting portion 813 is disposed so as to substantially coincide with the connecting portion 73 of the clip 70 in the Z direction. Each of the connecting portions 813 faces the connecting portion 73 in the X direction. The connecting portion 813 and the connecting portion 73 face each other not along the plate surface but on the end surface (side surface). The connecting portion 813 is disposed so as to include and surround the connecting portion 73 in a plan view perpendicular to the X direction. The connecting portion 813 runs in parallel over the entire length of the connecting portion 73.

The third wiring 80 includes two negative electrode terminals 82. Each of the negative electrode terminals 82 extends in the Y direction. The negative electrode terminal 82 is bonded to the corresponding end portion 812, for example. The two negative electrode terminals 82 are arranged so that the positive electrode terminal 52 is interposed between the two negative electrode terminals 82 in the X direction.

As an example, the thickness of the negative electrode terminal 82 is substantially equal to that of the positive electrode terminal 52. The negative electrode terminal 82 is disposed so as to substantially coincide with the positive electrode terminal 52 in the Z direction. Each of the negative electrode terminals 82 faces the positive electrode terminal 52 in the X direction. The negative electrode terminal 82 and the positive electrode terminal 52 face each other not along the plate surface but on the end surface (side surface). The negative electrode terminal 82 faces the positive electrode terminal 52 in most of the entire length. The other configurations are the same as or similar to the configurations described in the preceding embodiment.

Summary of Second Embodiment

In the present embodiment, similarly to the preceding embodiment, the clip 70 is used to connect the source electrode 40S (second main electrode) of the semiconductor element 40H (first element) and the second wiring 60 including the output terminal 62 (output terminal portion). The third wiring 80 including the negative electrode terminal 82 (second power supply terminal portion) is arranged in parallel with not only the first wiring 50 including the positive electrode terminal 52 (first power supply terminal portion) but also the clip 70. Therefore, the inductance in the upper and lower arm circuits 9 (main circuit) can be reduced.

In the present embodiment, the clip 81 of the third wiring 80 runs in parallel to the clip 70 and faces the clip 70 in the width direction (X direction). The negative electrode terminal 82 of the third wiring 80 runs in parallel and faces the positive electrode terminal 52 of the first wiring 50 in the width direction (X direction). The end surfaces (side surfaces) of the third wiring 80, the first wiring 50, and the clip 70 face each other. Therefore, it is possible to further reduce the height while reducing the inductance. Since the PN current loop becomes small due to the facing arrangement in the width direction, the inductance can be reduced.

The clip 81 may have one end portion 812 and the connecting portion 813. That is, the clip 81 may be provided so as to face only one side surface of the positive electrode terminal 52 and the clip 70 in the X direction. As an example, the clip 81 of the present embodiment is branched into two pieces. The clip 81 faces the positive electrode terminal 52 and the clip 70 on both sides in the X direction. Accordingly, the facing area can be increased, and the inductance can be further reduced.

The parallel arrangement and the facing arrangement in the X direction described in the present embodiment can be combined with various configurations described in the preceding embodiment.

Third Embodiment

This embodiment is a modification based on the preceding embodiments, and the description of the preceding embodiment can be incorporated. In the preceding embodiment, the parallel arrangement is applied to a configuration in which one semiconductor element forms one arm. Alternatively, the parallel arrangement may be applied to a configuration in which plural semiconductor elements form one arm.

<Power Conversion Device>

Figure 12:
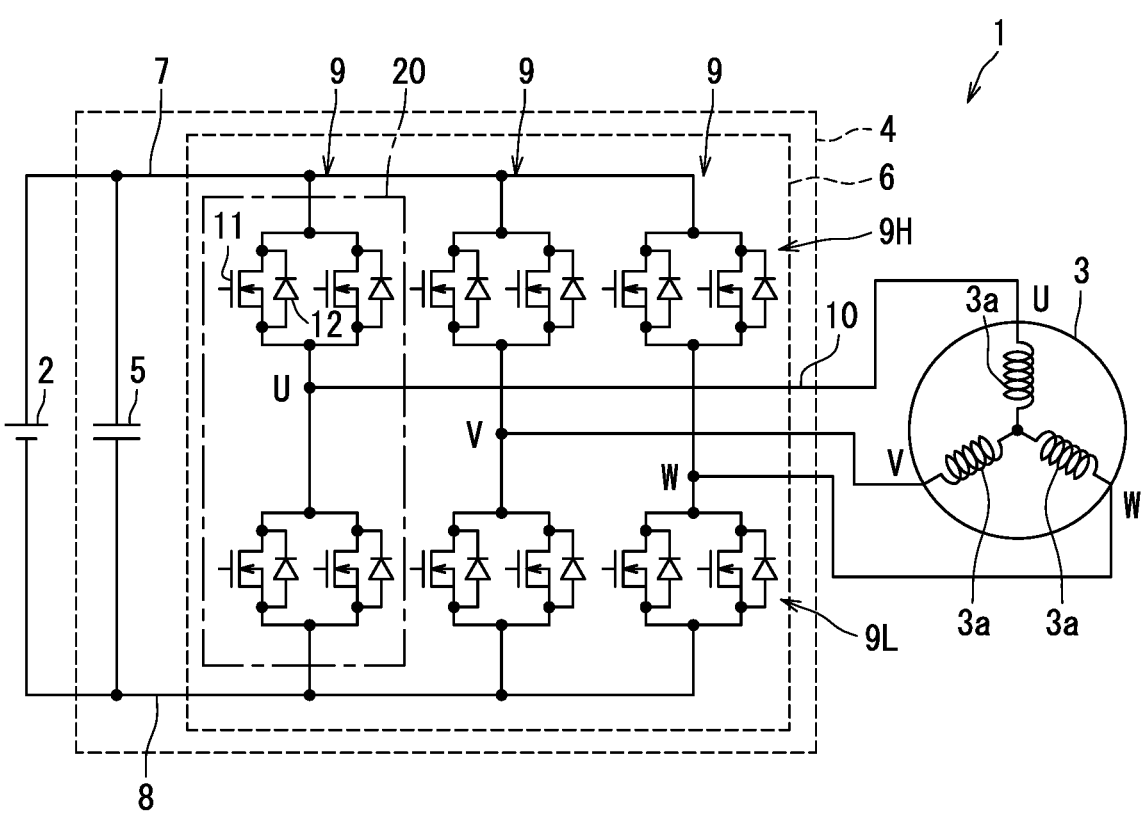
FIG. 12 is a diagram illustrating a circuit configuration of a power conversion device according to a third embodiment.

FIG. 12 shows a circuit configuration of the power conversion device 4 according to the present embodiment. As shown in FIG. 12, the inverter 6 includes upper and lower arm circuits 9 for three phases. As an example, in the present embodiment, each arm has two MOSFETs 11. The two MOSFETs 11 constituting one arm are connected in parallel. In the upper arm 9H, the drains of the two MOSFETs 11 connected in parallel are connected to the P line 7. In the lower arm 9L, the sources of the two MOSFETs 11 connected in parallel are connected to the N line 8. The sources of the two MOSFETs 11 connected in parallel in the upper arm 9H and the drains of the two MOSFETs 11 connected in parallel in the lower arm 9L are connected to each other.

The two MOSFETs 11 connected in parallel are turned on and off at the same timing by a common gate drive signal (drive voltage). A freewheeling diode 12 is connected in anti-parallel to each of the MOSFETs 11. The upper and lower arm circuits 9 for one phase is provided by one semiconductor device 20.

<Semiconductor Device>

Figure 13:
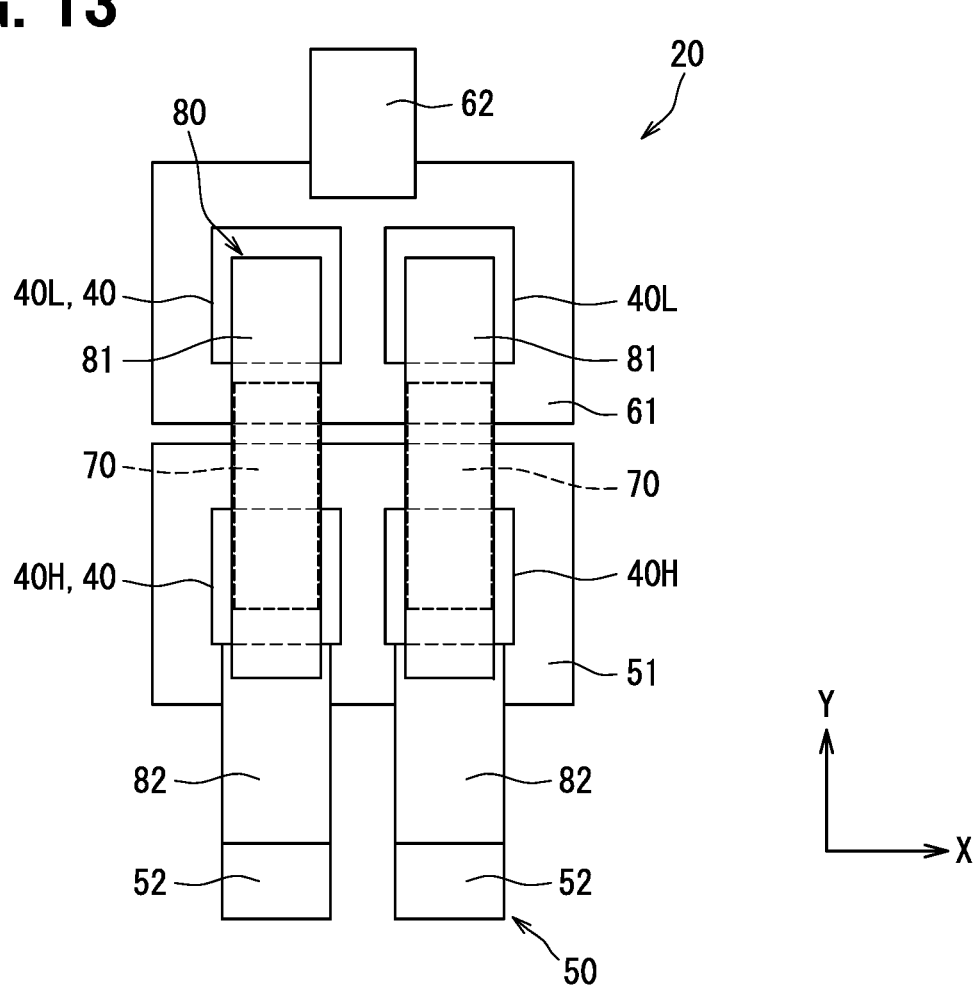
FIG. 13 is a plan view illustrating the semiconductor device.

FIG. 13 is a plan view showing the semiconductor device 20 according to the present embodiment. In FIG. 13, the sealing body 30 and the signal terminal 90 are omitted for the sake of convenience. FIG. 13 corresponds to FIG. 4.

The semiconductor device 20 illustrated in FIG. 13 employs the parallel arrangement described in the preceding embodiment and the facing arrangement facing each other in the Z direction. Two semiconductor elements 40H are disposed on one surface of the heat sink 51. The drain electrodes 40D of the semiconductor elements 40H are connected to the heat sink 51 common to each other. The two semiconductor elements 40H are arranged side by side in the X direction.

The same number of semiconductor elements 40L as the number of semiconductor elements 40H, that is, two semiconductor elements 40L are arranged on one surface of the heat sink 61. The drain electrodes 40D of the semiconductor elements 40L are connected to a common heat sink 61. The two semiconductor elements 40L are arranged side by side in the X direction. One of the semiconductor elements 40L is aligned with one of the semiconductor elements 40H in the Y direction. The other of the semiconductor elements 40L is aligned with the other of the semiconductor elements 40H in the Y direction.

The first wiring 50 includes one heat sink 51 and two positive electrode terminals 52. Each of the positive electrode terminals 52 extends in the Y direction. One of the positive electrode terminals 52 is aligned in the Y direction with one set of the semiconductor elements 40H and 40L. The other of the positive electrode terminals 52 is aligned in the Y direction with the other set of the semiconductor elements 40H and 40L. The two positive electrode terminals 52 are arranged in the X direction.

The semiconductor device 20 includes two clips 70 and two third wirings 80. Each of the clips 70 extends in the Y direction. One of the clips 70 is aligned in the Y direction with one set of the semiconductor elements 40H and 40L. The other of the clips 70 is aligned in the Y direction with the other set of the semiconductor elements 40H and 40L. One of the clips 70 electrically connects the source electrode 40S of one of the semiconductor elements 40H to the heat sink 61. The other of the clips 70 electrically connects the source electrode 40S of the other of the semiconductor elements 40H to the heat sink 61. The two clips 70 are arranged in the X direction.

Each of the third wirings 80 extends in the Y direction. One of the negative electrode terminals 82 faces one of the positive electrode terminals 52 in the Z direction, and the other of the negative electrode terminals 82 faces the other of the positive electrode terminals 52 in the Z direction. One of the clips 81 electrically connects the source electrode 40S of one of the semiconductor elements 40L to one of the negative electrode terminals 82. The other of the clips 81 electrically connects the source electrode 40S of the other of the semiconductor elements 40L to the other of the negative electrode terminals 82. One of the clips 81 faces one of the clips 70 in the Z direction, and the other of the clips 81 faces the other of the clips 70 in the Z direction. The two third wirings 80 are arranged in the X direction.

For example, the semiconductor device 20 is symmetrically arranged with respect to an imaginary line substantially parallel to the Y direction. The two semiconductor elements 40H, the two semiconductor elements 40L, the two positive electrode terminals 52, the two clips 70, and the two third wirings 80 are symmetrically arranged with respect to the imaginary line. The output terminals 62 are also symmetrically arranged with respect to the imaginary line. Other configurations are the same as the configurations described in the preceding embodiments (see FIGS. 2 to 6).

Summary of Third Embodiment

According to the present embodiment, it is possible to achieve the same effect as that of the preceding embodiment.

Specifically, as in the preceding embodiment, the clip 70 is used to connect the source electrode 40S of the semiconductor element 40H and the second wiring 60 including the output terminal 62. The third wiring 80 including the negative electrode terminal 82 is arranged in parallel with not only the first wiring 50 including the positive electrode terminal 52 but also the clip 70. Therefore, in the configuration in which the semiconductor elements 40H, 40L are connected in parallel, the inductance of the upper and lower arm circuits 9 can be reduced. By using the clip 70, the PN current loop of the main circuit wiring can be reduced, and the inductance can be reduced. In addition, the semiconductor device 20 can be reduced in height by the single-sided heat dissipation structure.

As an example, also in the present embodiment, the third wiring 80 extends in parallel over the entire length of the corresponding clip 70 in a plan view. Since the parallel running distance is long, the inductance can be further reduced.

As an example, also in the present embodiment, the third wiring 80 runs parallel to the first wiring 50 and the clip 70 while facing in the Z direction. That is, the plate surfaces face each other. Accordingly, the facing area can be increased, and the inductance can be effectively reduced.

(Modification)

The semiconductor device 20 including the two semiconductor elements 40H and the two semiconductor elements 40L is not limited to have the two positive electrode terminals 52, the two clips 70, and the two third wirings 80. The number of at least one of the positive electrode terminal 52, the clip 70, and the third wiring 80 may be one. For example, as illustrated in FIG. 14, the semiconductor device 20 may include one positive electrode terminal 52, one clip 70, and one third wiring 80.

Figure 14:
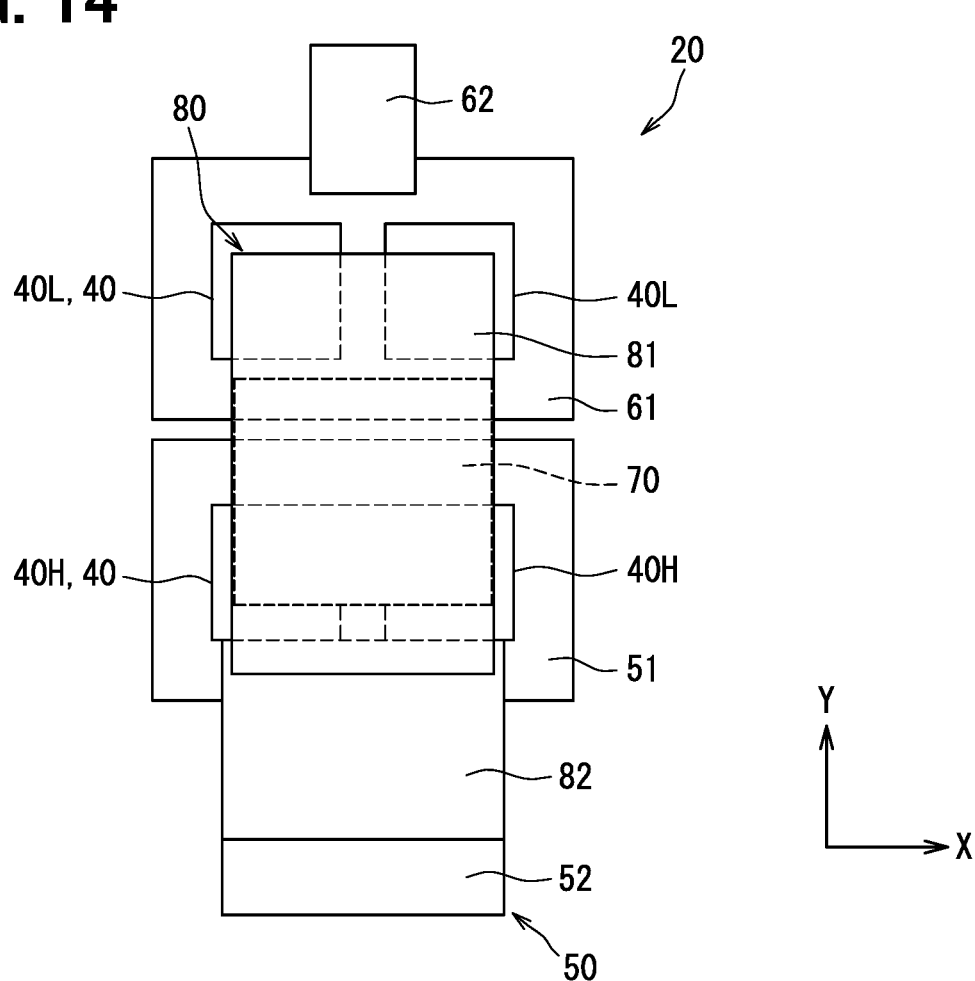
FIG. 14 is a diagram illustrating a modification.

In FIG. 14, the positive electrode terminal 52 is provided so as to include the two positive electrode terminals 52 shown in FIG. 13. The clip 70 is provided so as to overlap the source electrodes 40S of the two semiconductor elements 40H in a plan view. The clip 70 is provided so as to include the two clips 70 shown in FIG. 13. The clip 81 of the third wiring 80 is provided so as to overlap the source electrodes 40S of the two semiconductor elements 40L in a plan view. The clip 81 is provided so as to include the two clips 81 shown in FIG. 13. The negative electrode terminal 82 is provided so as to include the two negative electrode terminals 82 shown in FIG. 13. With the above configuration, the facing area can be increased to further reduce the inductance.

The parallel connection structure of the semiconductor element 40 described in the present embodiment can be combined with various configurations described in the first embodiment and the second embodiment. For example, it may be combined with the parallel arrangement with the facing arrangement facing in the X direction.

Fourth Embodiment

This embodiment is a modification based on the preceding embodiments, and the description of the preceding embodiment can be incorporated. In the preceding embodiment, the parallel arrangement is applied to the semiconductor device for upper and lower arm circuits of one phase. Alternatively, the present disclosure may be applied to a semiconductor device for upper and lower arm circuits of plural phases.

Figure 15:
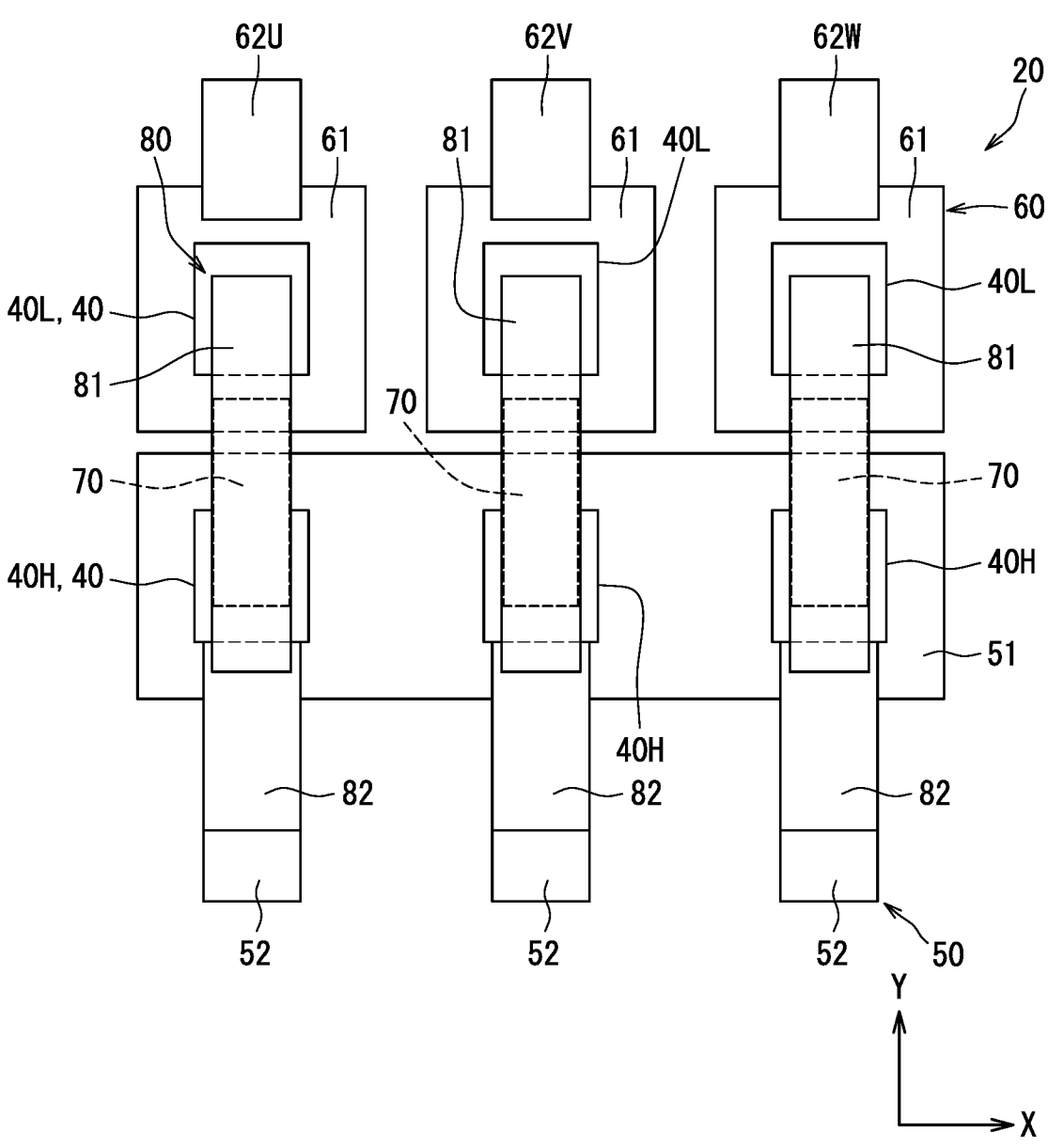
FIG. 15 is a plan view illustrating a semiconductor device according to a fourth embodiment.

FIG. 15 is a plan view showing the semiconductor device 20 according to the present embodiment. In FIG. 15, the sealing body 30 and the signal terminal 90 are omitted for the sake of convenience. FIG. 15 corresponds to FIG. 4.

The semiconductor device 20 constitutes upper and lower arm circuits 9 of three phases. That is, the inverter 6 is configured. As an example, each arm is configured by one semiconductor element 40. The semiconductor device 20 includes six semiconductor elements 40, specifically, three semiconductor elements 40H and three semiconductor elements 40L. The three semiconductor elements 40H are arranged in a row in the X direction. The three semiconductor elements 40L are arranged in the X direction. The semiconductor elements 40H and 40L are arranged in the Y direction for each phase.

The semiconductor device 20 includes three second wirings 60. The second wiring 60 is arranged for each phase. One of the second wirings 60 has a U-phase output terminal 62U, another one of the second wirings 60 has a V-phase output terminal 62V, and the other one of the second wirings 60 has a W-phase output terminal 62W. The three second wirings 60 are arranged side by side in the X direction.

The semiconductor element 40L constituting the lower arm 9L of the U phase is disposed on the heat sink 61 of the second wiring 60 having the output terminal 62U. The semiconductor element 40L constituting the lower arm 9L of the V phase is disposed on the heat sink 61 of the second wiring 60 having the output terminal 62V. The semiconductor element 40L constituting the lower arm 9L of the W phase is disposed on the heat sink 61 of the second wiring 60 having the output terminal 62W.

As an example, the first wiring 50 includes one heat sink 51 and three positive electrode terminals 52. The semiconductor device 20 includes three clips 70 and three third wirings 80. The three semiconductor elements 40H are arranged on the heat sink 51. Each of the clips 70 extends in the Y direction. One of the clips 70 electrically connects the source electrode 40S of the semiconductor element 40H for the upper arm 9H of the U phase to the heat sink 61. Another one of the clips 70 electrically connects the source electrode 40S of the semiconductor element 40H for the upper arm 9H of the V phase to the heat sink 61. The other one of the clips 70 electrically connects the source electrode 40S of the semiconductor element 40H for the upper arm 9H of the W phase to the heat sink 61. The three clips 70 are arranged in the X direction.

Each of the third wirings 80 extends in the Y direction. One of the clips 81 electrically connects the source electrode 40S of the semiconductor element 40L for the lower arm 9L of the U phase to the corresponding negative electrode terminal 82. Another one of the clips 81 electrically connects the source electrode 40S of the semiconductor element 40L for the lower arm 9L of the V phase to the corresponding negative electrode terminal 82. The other one of the clips 81 electrically connects the source electrode 40S of the semiconductor element 40L for the lower arm 9L of the W phase to the corresponding negative electrode terminal 82. Each of the negative electrode terminals 82 faces the corresponding positive electrode terminal 52 in the Z direction. Each of the clips 81 faces the corresponding clip 70 in the Z direction. The three third wirings 80 are arranged in the X direction.

For example, the semiconductor device 20 is symmetrically arranged with respect to an imaginary line substantially parallel to the Y direction. The three semiconductor elements 40H, the three semiconductor elements 40L, the three positive electrode terminals 52, the three output terminals 62U, 62V, 62W, the three clips 70, and the three third wirings 80 are symmetrically arranged with respect to the imaginary line. Other configurations are the same as the configurations described in the preceding embodiments (see FIGS. 2 to 6).

Summary of Fourth Embodiment

According to the present embodiment, it is possible to achieve the same effect as that of the preceding embodiment. Specifically, as in the preceding embodiment, the clip 70 is used to connect the source electrode 40S of the semiconductor element 40H and the second wiring 60 including the output terminal 62. The third wiring 80 including the negative electrode terminal 82 is arranged in parallel with not only the first wiring 50 including the positive electrode terminal 52 but also the clip 70. Therefore, in the semiconductor device 20 constituting the upper and lower arm circuits 9 of plural phases, the inductance of the upper and lower arm circuits 9 can be reduced. By using the clip 70, the PN current loop of the main circuit wiring can be reduced, and the inductance can be reduced. In addition, the semiconductor device 20 can be reduced in height by the single-sided heat dissipation structure.

As an example, also in the present embodiment, the third wiring 80 extends in parallel over the entire length of the corresponding clip 70 in a plan view. Since the parallel running distance is long, the inductance can be further reduced.

As an example, also in the present embodiment, the third wiring 80 runs parallel to the first wiring 50 and the clip 70 while facing in the Z direction. That is, the plate surfaces face each other. Accordingly, the facing area can be increased, and the inductance can be effectively reduced.

(Modification)

The plural phases are not limited to three phases. For example, two phases may be used.

The semiconductor device 20 constituting the upper and lower arm circuits 9 of three phases is not limited to include the three positive electrode terminals 52, the three clips 70, and the three third wirings 80. The number of at least one of the positive electrode terminal 52, the clip 70, and the third wiring 80 may be one. For example, as illustrated in FIG. 16, the semiconductor device 20 may include one positive electrode terminal 52, one clip 70, and one third wiring 80.

Figure 16:
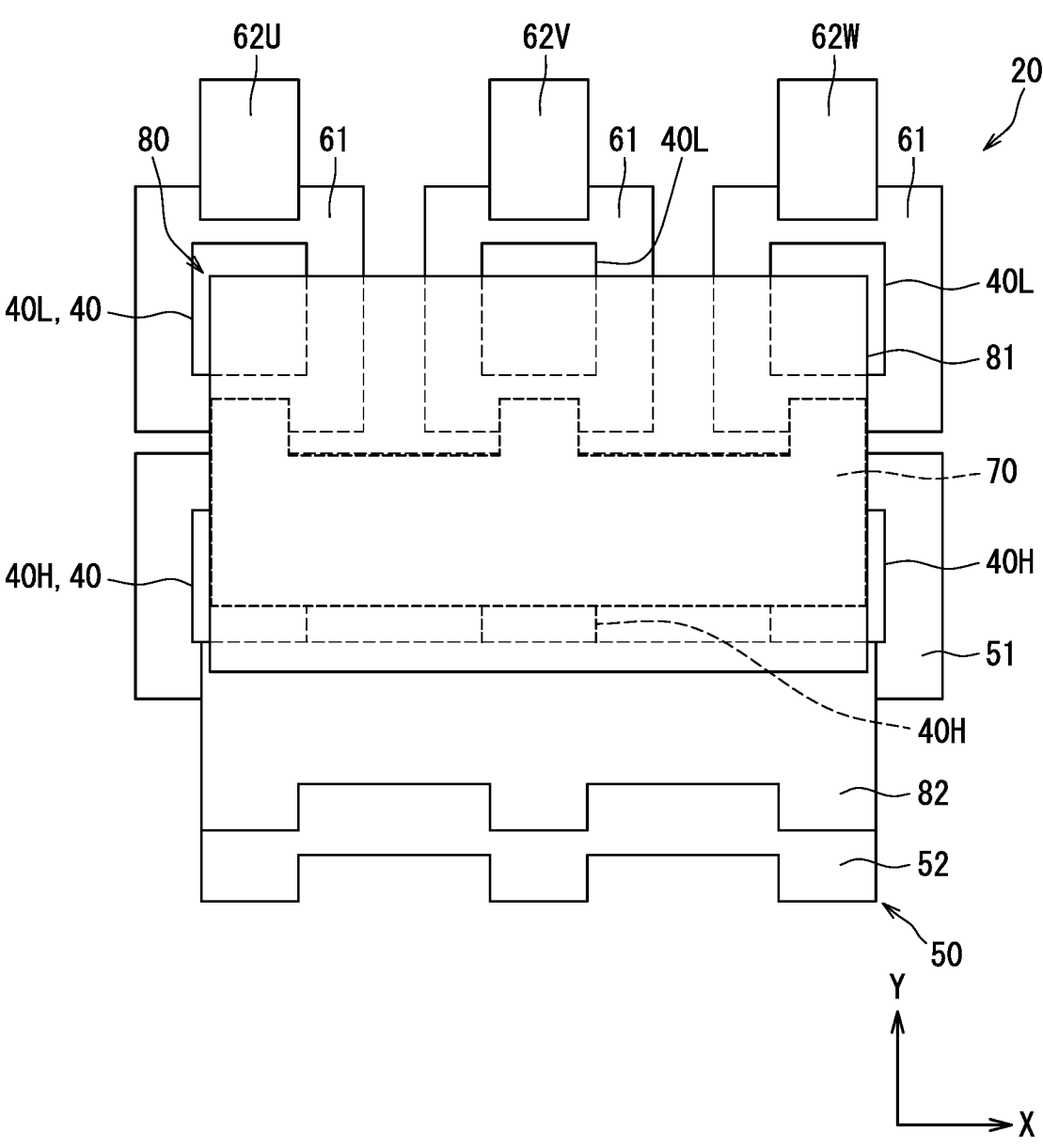
FIG. 16 is a diagram illustrating a modification.

In FIG. 16, the positive electrode terminal 52 is provided so as to include the three positive electrode terminals 52 shown in FIG. 15. The clip 70 is provided so as to overlap the source electrodes 40S of the three semiconductor elements 40H in a plan view. The clip 70 is provided so as to include the three clips 70 shown in FIG. 15. The clip 81 of the third wiring 80 is provided so as to overlap the source electrodes 40S of the three semiconductor elements 40L in a plan view. The clip 81 is provided so as to include the three clips 81 shown in FIG. 15. The negative electrode terminal 82 is provided so as to include the three negative electrode terminals 82 shown in FIG. 15. With the above configuration, the facing area can be increased to further reduce the inductance.

The configuration for providing the upper and lower arm circuits 9 of plural phases described in the present embodiment can be combined with various configurations described in the first embodiment, the second embodiment, and the third embodiment. For example, it may be combined with a parallel arrangement with a facing arrangement facing in the X direction. For example, it may be combined with a parallel connection structure of the arms.

Other Embodiments

The disclosure in this specification, the drawings, and the like is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional members which may be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiments. The several technical scopes disclosed are indicated by the description of the claims, and should be further understood to include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Hence, various technical ideas can be extracted from the disclosure of the specification, the drawings, and the like without being bound by the description of the claims.

When an element or layer is referred to as being "on," "coupled," "connected," or "combined," it may be directly on, coupled, connected, or combined to the other element or layer, or further, intervening elements or layers may be present. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element (s) or feature (s) as illustrated. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

The vehicle drive system 1 is not limited to the above structure described in the embodiments. The number of motor generator 3 is not limited to one. Multiple motor generators may be provided. The power conversion device 4 is not limited to include the inverter 6 as the electric power conversion device. For example, plural inverters may be provided. At least one inverter and a converter may be provided. Only the converter may be provided.

The semiconductor element 40 is not limited to include the MOSFET 11 as the switching element. For example, an IGBT may be employed. IGBT is an abbreviation for Insulated Gate Bipolar Transistor. An IGBT in which diodes are connected in antiparallel, that is, an RC-IGBT may be employed. RC is an abbreviation for Reverse Conducting.

The semiconductor device 20 is not limited to include the sealing body 30. A configuration in which the sealing body 30 is excluded may be employed.

In the semiconductor module 100, a cooler different from the cooler 101 may be disposed on the one surface 30a of the sealing body 30.

The configuration of the signal terminal 90 is not limited to the above-described configuration. A relay wiring (not shown) may be provided inside the semiconductor device 20. The relay wiring electrically relays the signal terminal 90 and the pad. The relay wiring can improve the flexibility in arrangement of the signal terminals 90. For example, the signal terminal 90 may be disposed in the accommodation space of the case 31 and electrically connected to the pad of the semiconductor element 40.

Figure 17:
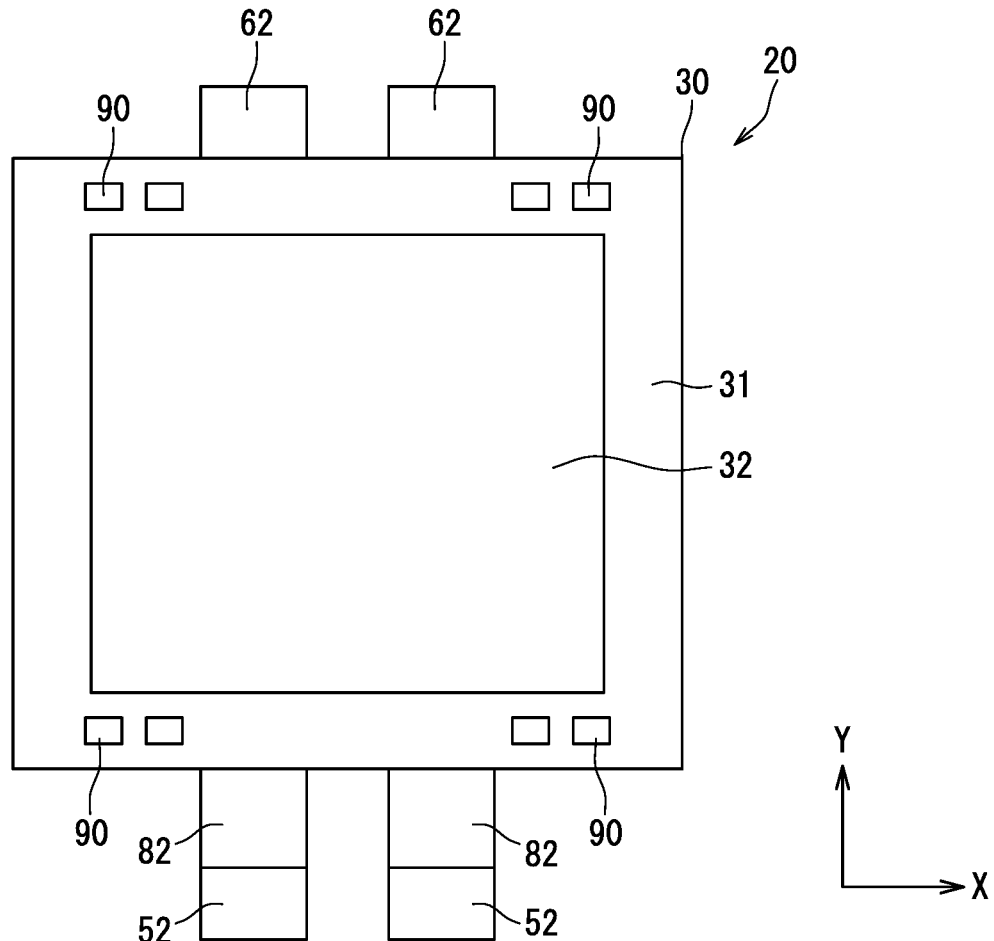
FIG. 17 is a diagram illustrating another modification.

In the configuration in which the signal terminal 90 is held by the case 31, the arrangement of the signal terminal 90 is not particularly limited. For example, in the semiconductor device 20 constituting the upper and lower arm circuits 9 of two phases, as illustrated in FIG. 17, the signal terminal 90 may be disposed outside the positive electrode terminal 52, the output terminal 62, and the negative electrode terminal 82 in the X direction. The terminal 52, 62, 82 is disposed between the signal terminal 90 connected to the pad of the semiconductor element 40 for one of the upper and lower arm circuits 9 and the signal terminal 90 connected to the pad of the semiconductor element 40 for the other of the upper and lower arm circuits 9, in the X direction.

Figure 18:
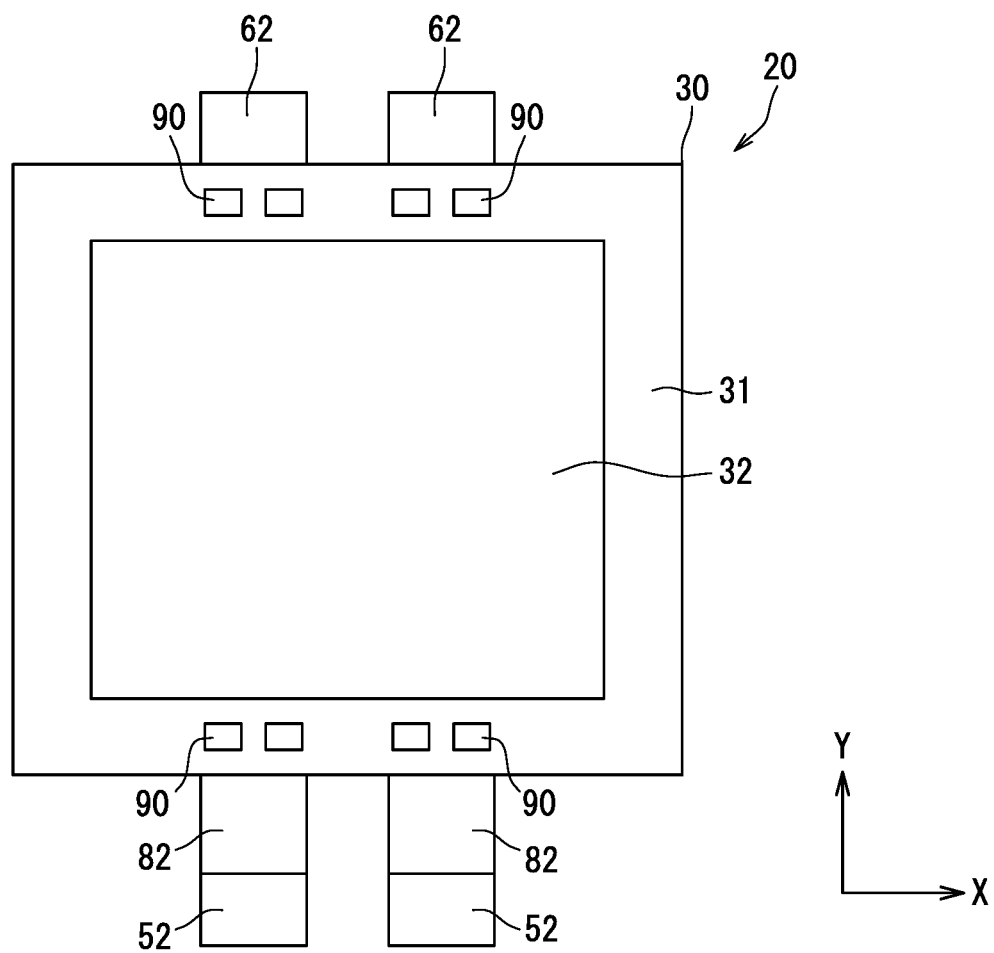
FIG. 18 is a diagram illustrating another modification.
Figure 19:
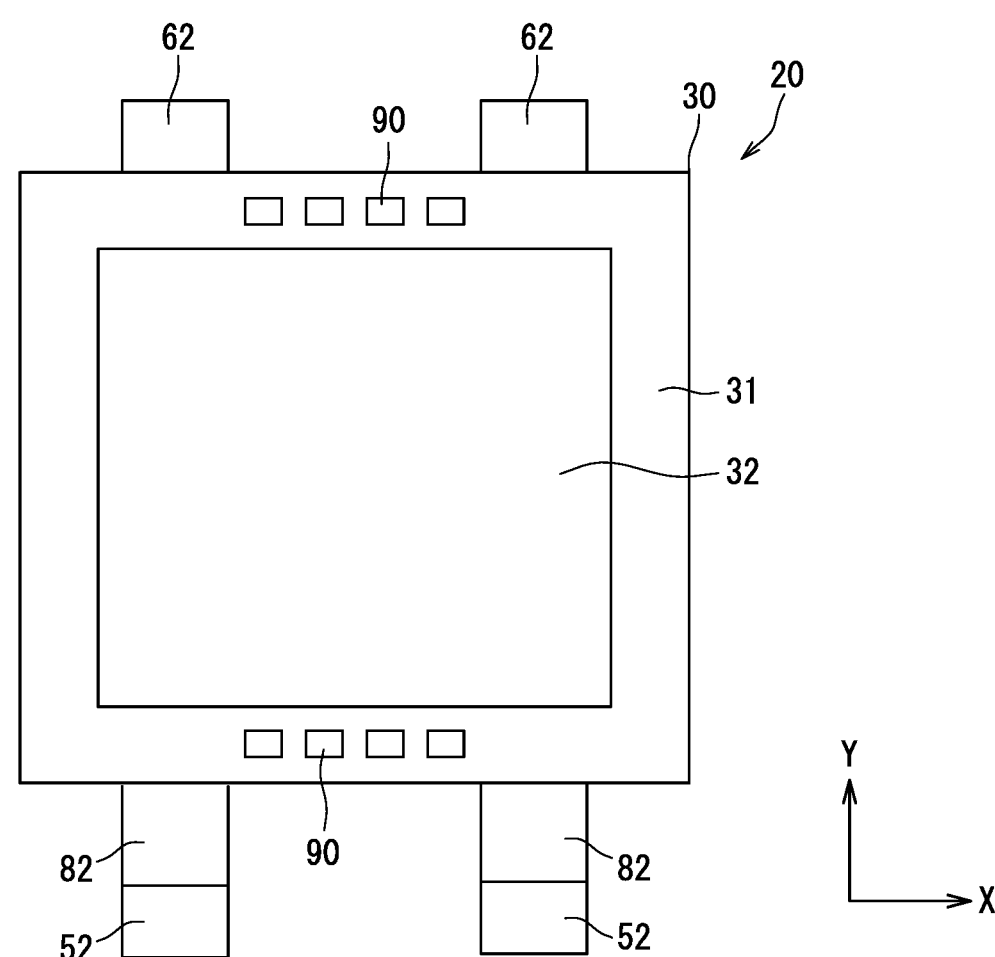
FIG. 19 is a diagram illustrating another modification.
Figure 20:
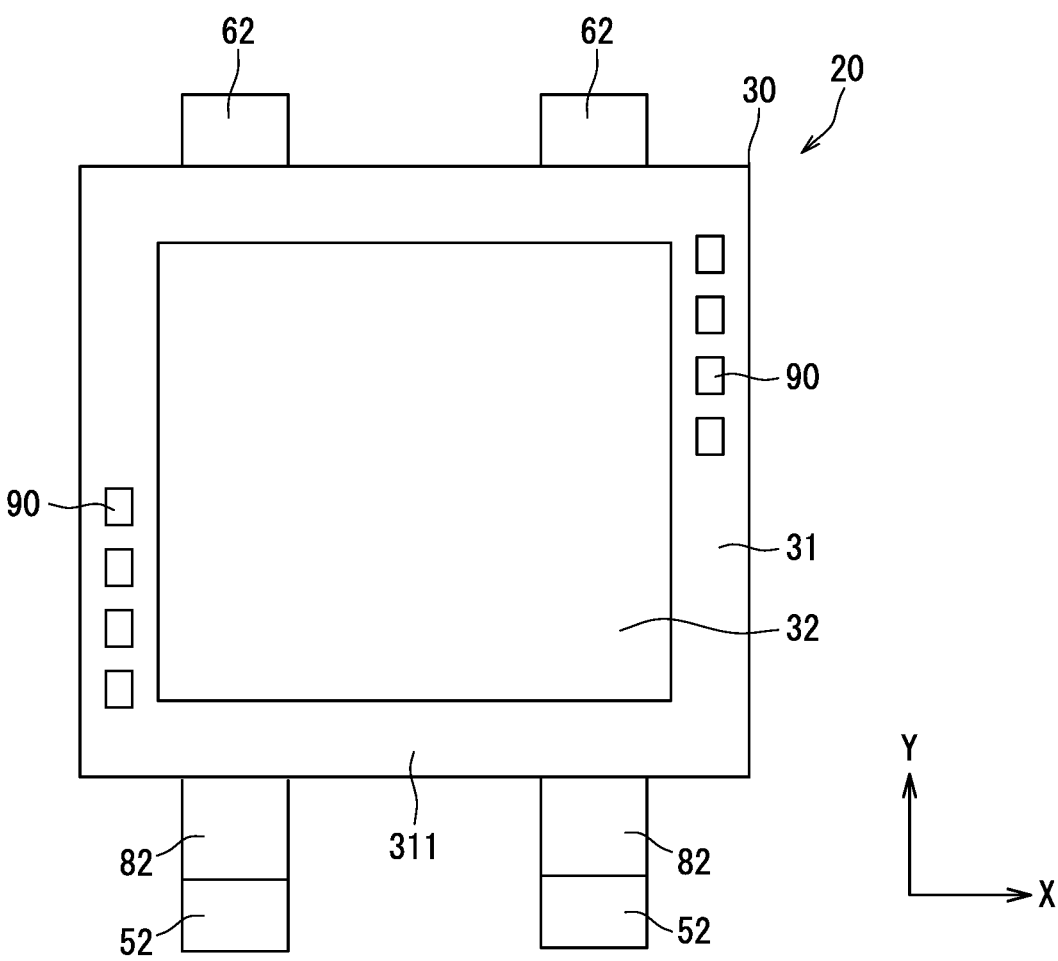
FIG. 20 is a diagram illustrating another modification.

Instead of FIG. 17, as shown in FIG. 18, the signal terminal 90 may be disposed at a position overlapping with the terminal 52, 62, 82 in the X direction. As shown in FIG. 19, the signal terminal 90 may be disposed between the terminals 52, 62, and 82. As shown in FIG. 20, the signal terminal 90 may be disposed on a side wall 311 different from the side wall 311 from which the terminal 52, 62, 82 is extended, among the four side walls 311 (side wall portions) forming a substantially rectangular ring shape.

Figures 21, 22:
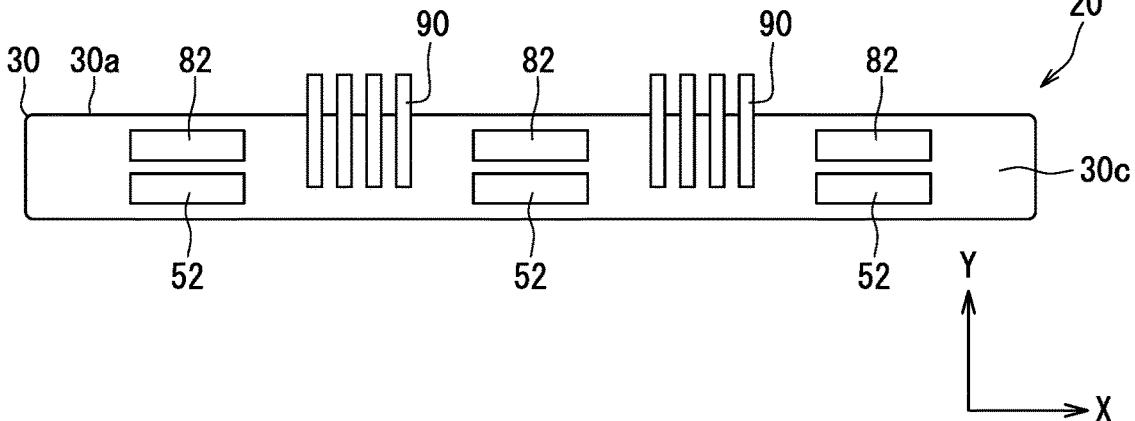
FIG. 21 is a diagram illustrating another modification.
FIG. 22 is a diagram illustrating another modification.
Figure 23:
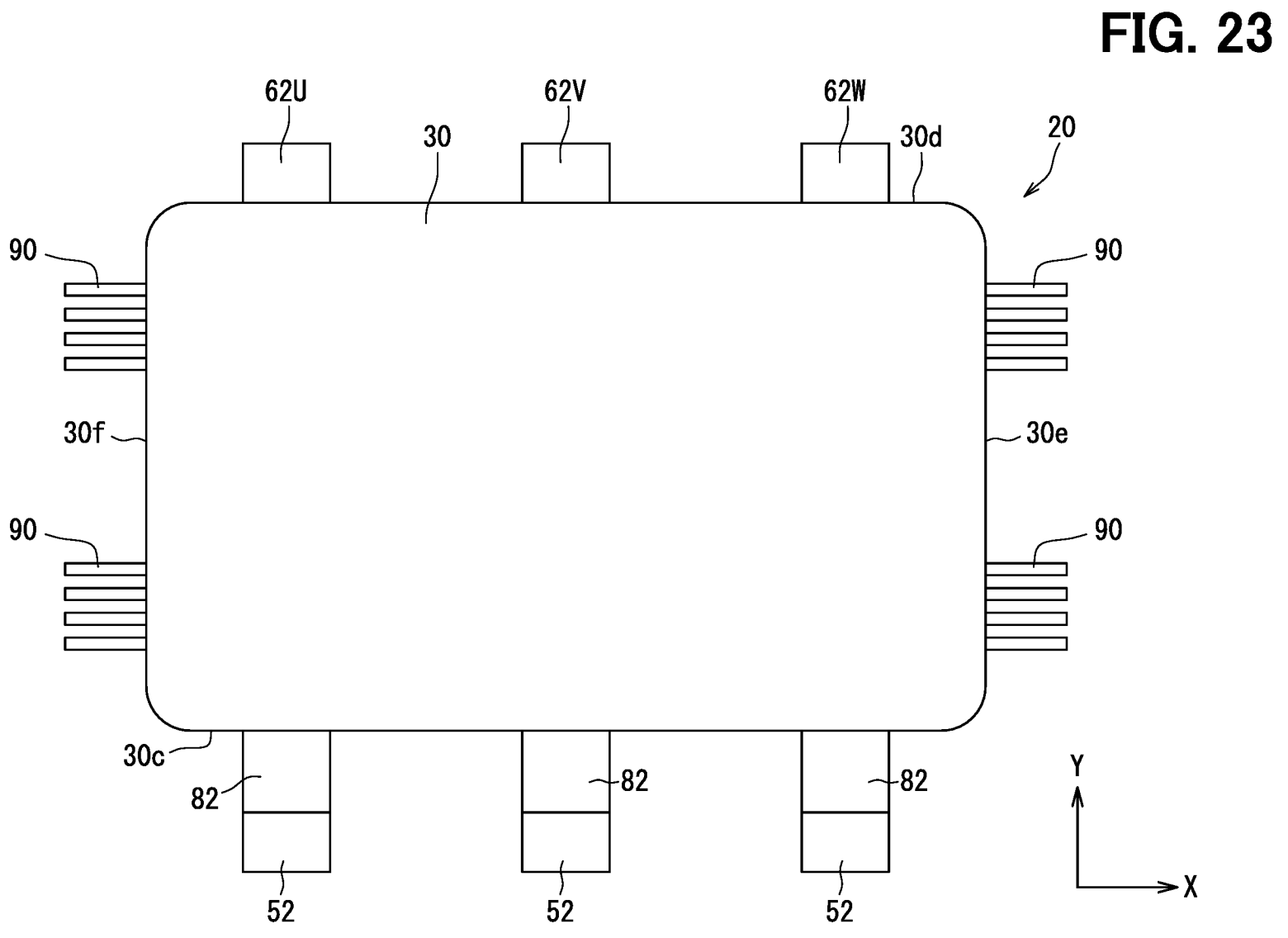

In a configuration in which the sealing body 30 is integrally molded by, for example, a transfer molding method, the arrangement of the signal terminals 90 is not particularly limited. For example, in the semiconductor device 20 constituting the upper and lower arm circuits 9 of three phases, as shown in FIGS. 21 and 22, the signal terminal 90 may protrude from the side surface 30c at position between the positive electrode terminals 52 (negative electrode terminals 82) arranged in the X direction. Similarly, the signal terminal 90 may protrude from the side surface 30d at position between the output terminals 62U, 62V, 62W of each phase. As shown in FIG. 23, the signal terminals 90 may protrude from the side surface 30e, 30f different from the side surface 30c, 30d from which the terminal 52, 62, 82 is led out.

Figure 24:
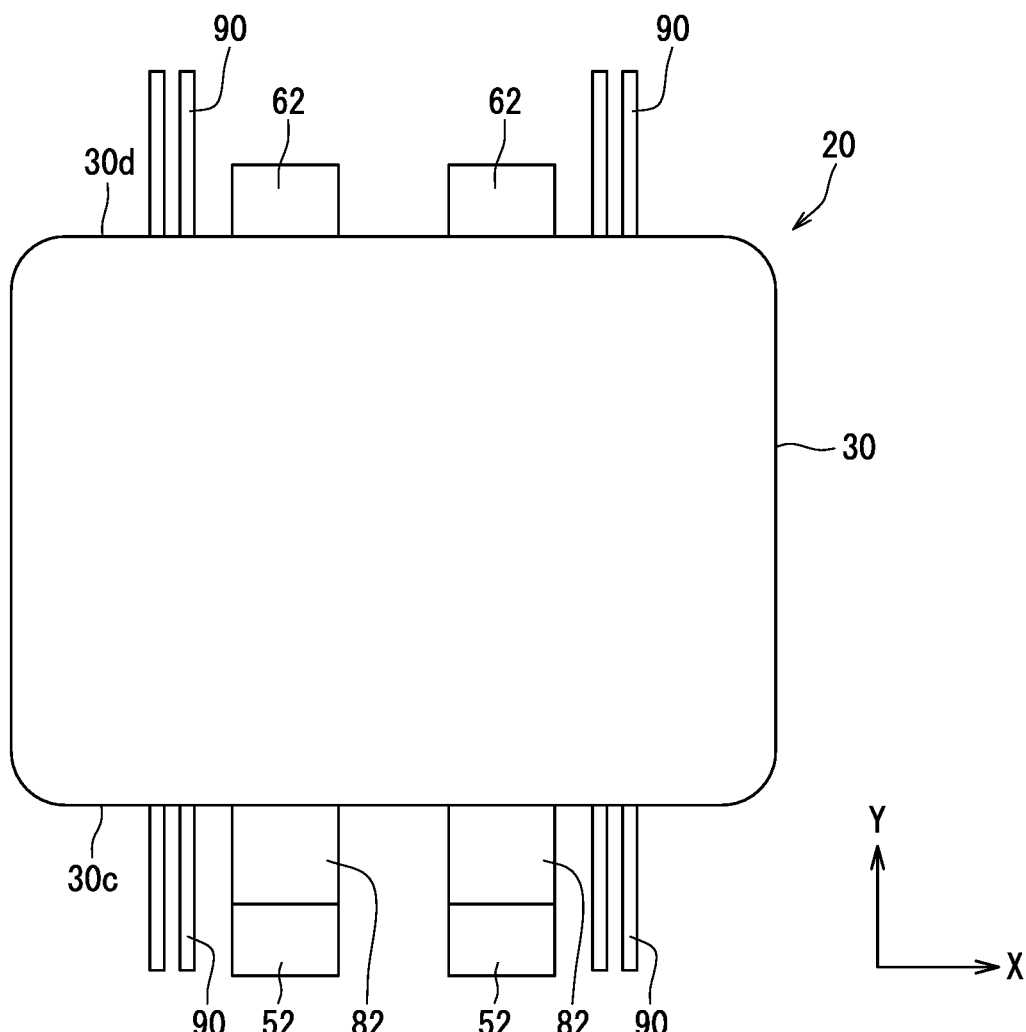
FIG. 24 is a diagram illustrating another modification.
Figure 25:
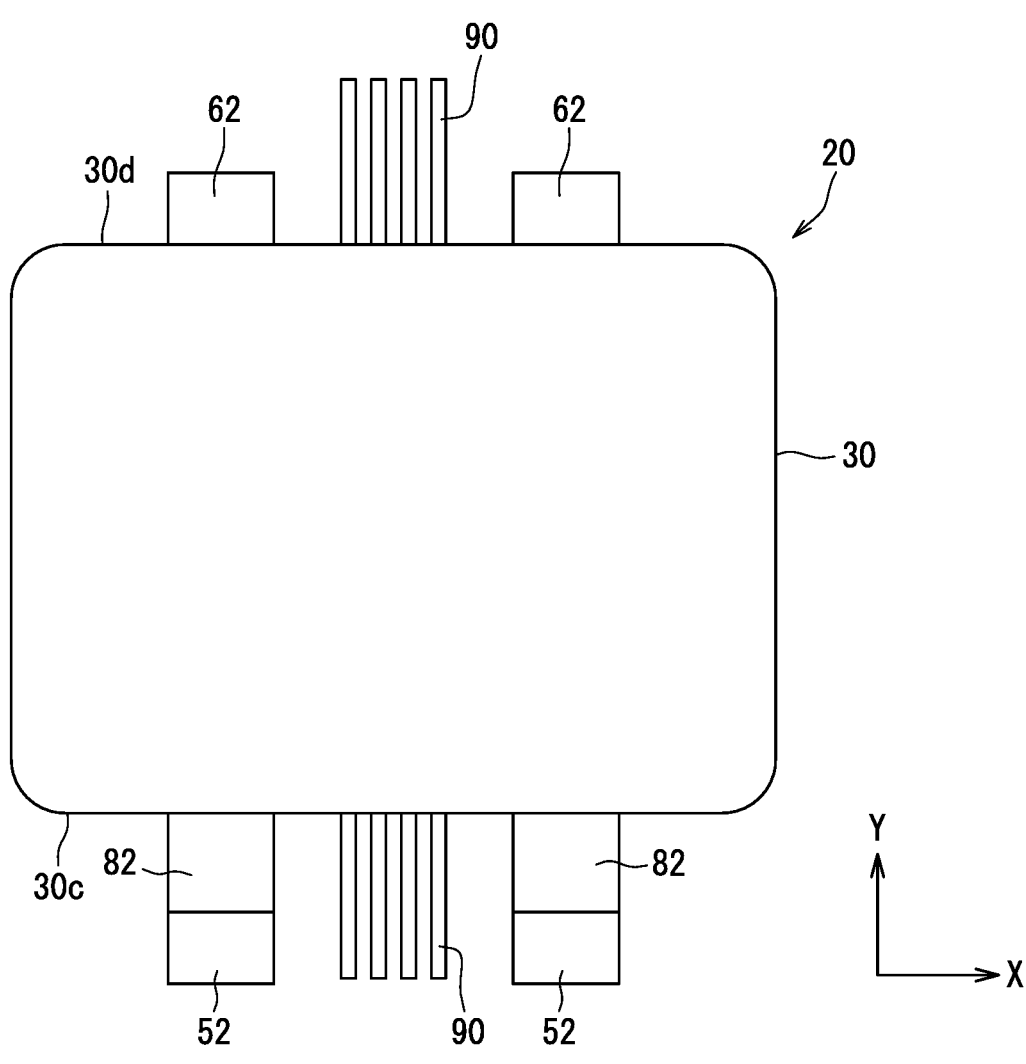
FIG. 25 is a diagram illustrating another modification.

For example, in the semiconductor device 20 constituting the upper and lower arm circuits 9 of two phases, as shown in FIG. 24, the signal terminal 90 may protrude from a position outside the positive electrode terminal 52, the output terminal 62, and the negative electrode terminal 82 in the X direction. As shown in FIG. 25, the signal terminal 90 may protrude from a position between the terminals 52, 62, and 82. Although not illustrated, the signal terminal 90 may protrude from the side surface 30e, 30f.

What is claimed is:

1. A semiconductor device for upper and lower arm circuits of at least one phase, comprising:
   a plurality of semiconductor elements including a first element for one arm of the upper and lower arm circuits and a second element for another arm of the upper and lower arm circuits, each having a first main electrode provided on one surface and a second main electrode provided on a back surface opposite to the one surface in a thickness direction;

a first wiring having a first mounting portion on which the first element is disposed and to which a first main electrode of the first element is connected, and a first power supply terminal portion connected to the first mounting portion;

a second wiring having a second mounting portion on which the second element is disposed and to which a first main electrode of the second element is connected, and an output terminal portion continuous with the second mounting portion, the first mounting portion and the second mounting portion being arranged in one direction orthogonal to the thickness direction;

a clip configured to electrically connect the second main electrode of the first element and the second mounting portion; and a third wiring having a connection portion to which a second main electrode of the second element is connected and a second power supply terminal portion connected to the connection portion, wherein the third wiring extends parallel to the first wiring and the clip, and the third wiring faces the first wiring and the clip in a width direction orthogonal to both the one direction and the thickness direction.

2. The semiconductor device according to claim 1, wherein the clip is a first clip, and the third wiring includes a second clip including the connection portion, and a terminal including the second power supply terminal portion and connected to the second clip.

3. The semiconductor device according to claim 1, wherein the first wiring, the clip, and the third wiring extend in the one direction in a plan view.

4. The semiconductor device according to claim 1, wherein a first part of the third wiring and a part of the first wiring are arranged in the width direction, a second part of the third wiring and a part of the clip are arranged in the width direction, and the third wiring faces each of the first wiring and the clip in the width direction over a predetermined length in the one direction.

5. The semiconductor device according to claim 1, wherein the third wiring has two extending portions extending in the one direction, the first wiring and the clip are interposed between the two extending portions in the width direction, and a part of the first wiring interposed between the two extending portions and a part of the clip interposed between the two extending portions are arranged in the one direction in a plan view.

6. The semiconductor device according to claim 1, wherein the third wiring has two extending portions extending in the one direction, and the clip is interposed between the two extending portions in the width direction.

7. The semiconductor device according to claim 6, wherein a thickness of the extending portions is equal to a thickness of the clip.

* * * * *